United States Patent
Dong et al.

(10) Patent No.: US 9,299,443 B1
(45) Date of Patent: Mar. 29, 2016

(54) MODIFYING PROGRAM PULSES BASED ON INTER-PULSE PERIOD TO REDUCE PROGRAM NOISE

(71) Applicant: SanDisk Technologies Inc., Plano, TX (US)

(72) Inventors: Yingda Dong, San Jose, CA (US); Liang Pang, Fremont, CA (US); Jiahui Yuan, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/500,655

(22) Filed: Sep. 29, 2014

(51) Int. Cl.
  *G11C 11/34* (2006.01)
  *G11C 16/10* (2006.01)
  *G11C 16/34* (2006.01)
  *G11C 16/04* (2006.01)

(52) U.S. Cl.
  CPC ............ *G11C 16/10* (2013.01); *G11C 16/0466* (2013.01); *G11C 16/3459* (2013.01)

(58) Field of Classification Search
  USPC ............ 365/185.17, 185.18, 185.19, 185.22, 365/185.29, 185.33
  See application file for complete search history.

(56) References Cited

U.S. PATENT DOCUMENTS

| | | | |
|---|---|---|---|
| 7,110,298 B2 | 9/2006 | Moogat et al. | |
| 7,675,780 B2 | 3/2010 | Lee et al. | |
| 8,274,838 B2 | 9/2012 | Dutta et al. | |
| 8,472,255 B2 | 6/2013 | Mokhlesi et al. | |
| 8,982,626 B2 * | 3/2015 | Dong ................ | G11C 11/5642 365/185.17 |
| 9,047,970 B2 * | 6/2015 | Wan ................... | G11C 11/5642 |
| 9,053,810 B2 * | 6/2015 | Dutta ................. | G11C 16/3459 |
| 2012/0014184 A1 | 1/2012 | Dutta et al. | |
| 2014/0254264 A1 | 9/2014 | Dutta et al. | |

FOREIGN PATENT DOCUMENTS

WO  WO2004/068500 A1  8/2004

OTHER PUBLICATIONS

International Search Report & The Written Opinion of the International Searching Authority dated Dec. 7, 2015.

* cited by examiner

*Primary Examiner* — Trong Phan
(74) *Attorney, Agent, or Firm* — Vierra Magen Marcus LLP

(57) ABSTRACT

Techniques are provided for more accurately programming memory cells by reducing program noise caused by charge loss in a programming pass in which the number of verify tests varies in different program loops. In an nth program loop, at least one programming characteristic is modified based on the number (N) of data states which were subject to verify tests in the n-$1^{st}$ program loop. For example, a reduced step size or pulse duration, or an elevated bit line voltage (Vbl) can be used. The reduction in the step size or pulse duration, or the increase in Vbl, is proportional to N. The modification of the at least one programming characteristic results in a slowdown of the programming of the memory cells so that program noise is reduced.

23 Claims, 17 Drawing Sheets

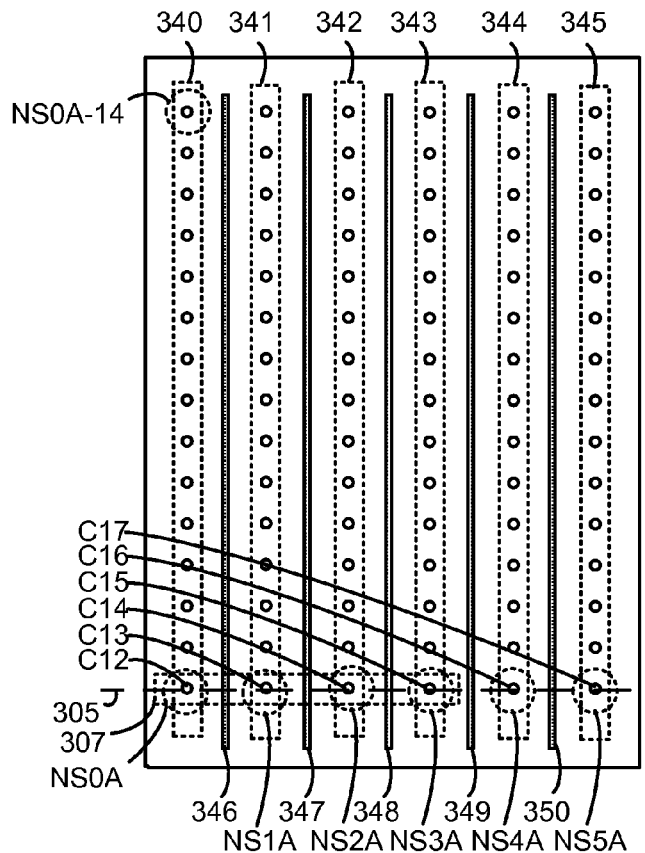
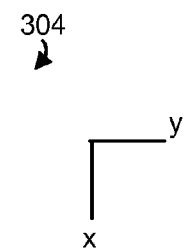
Fig. 3A
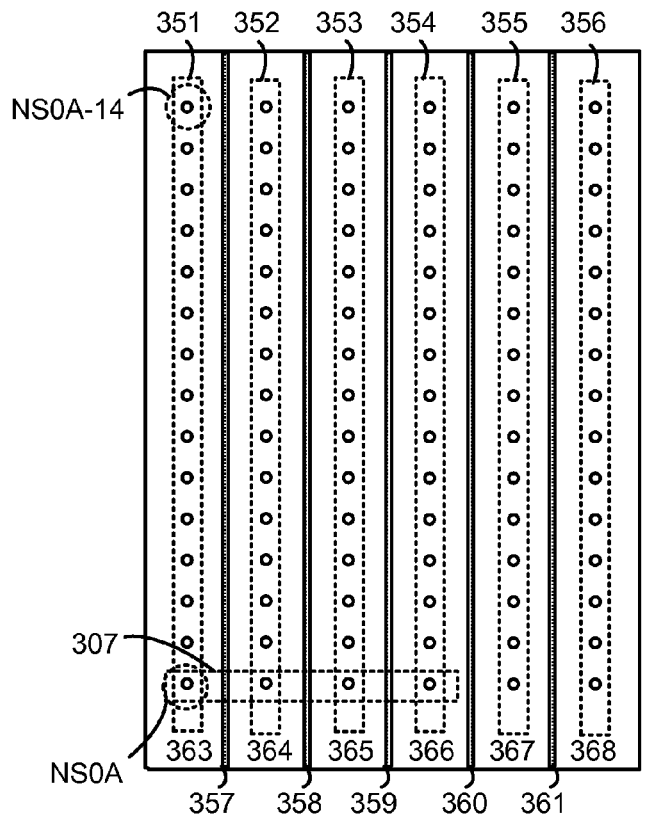
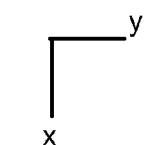
Fig. 3B

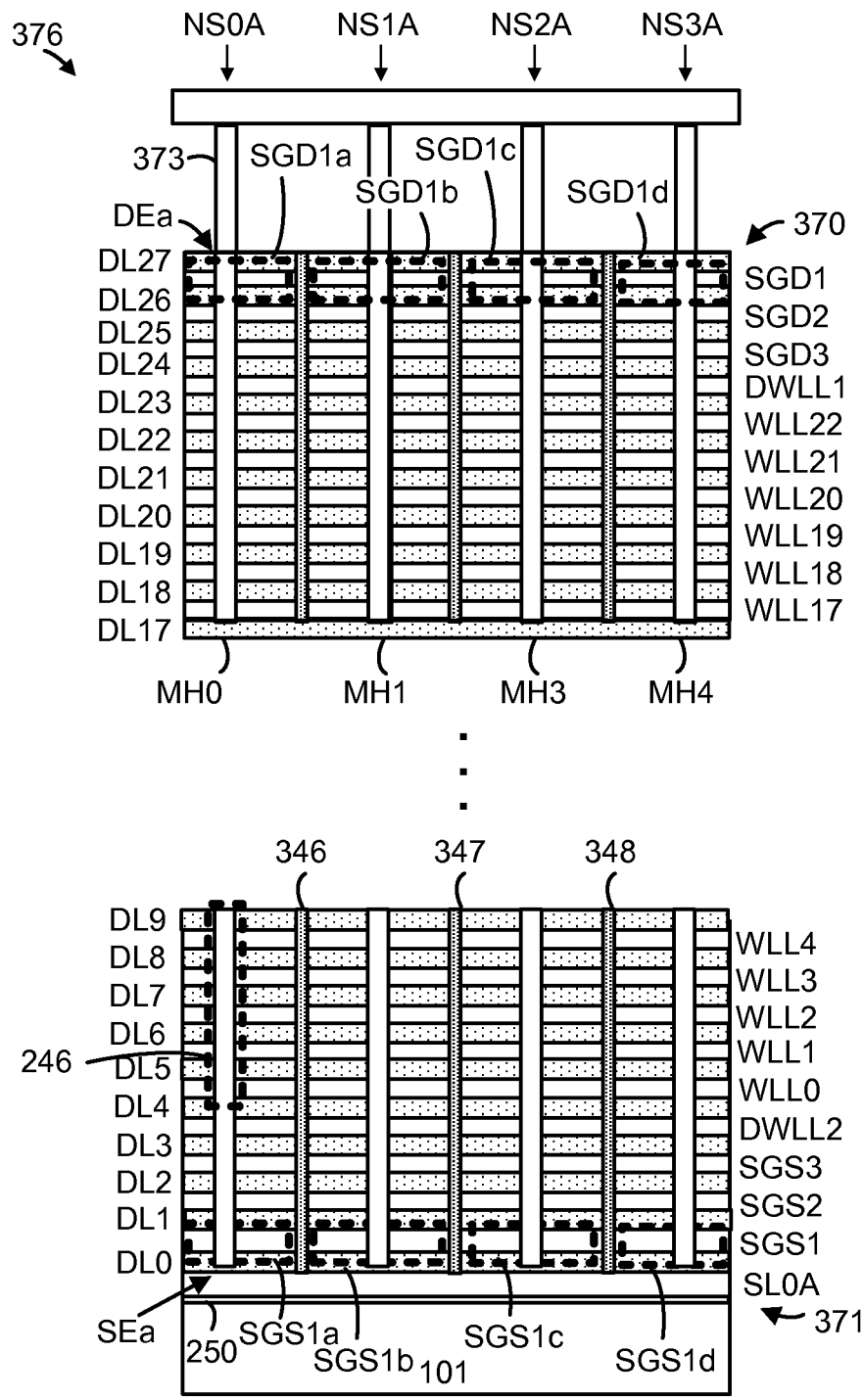

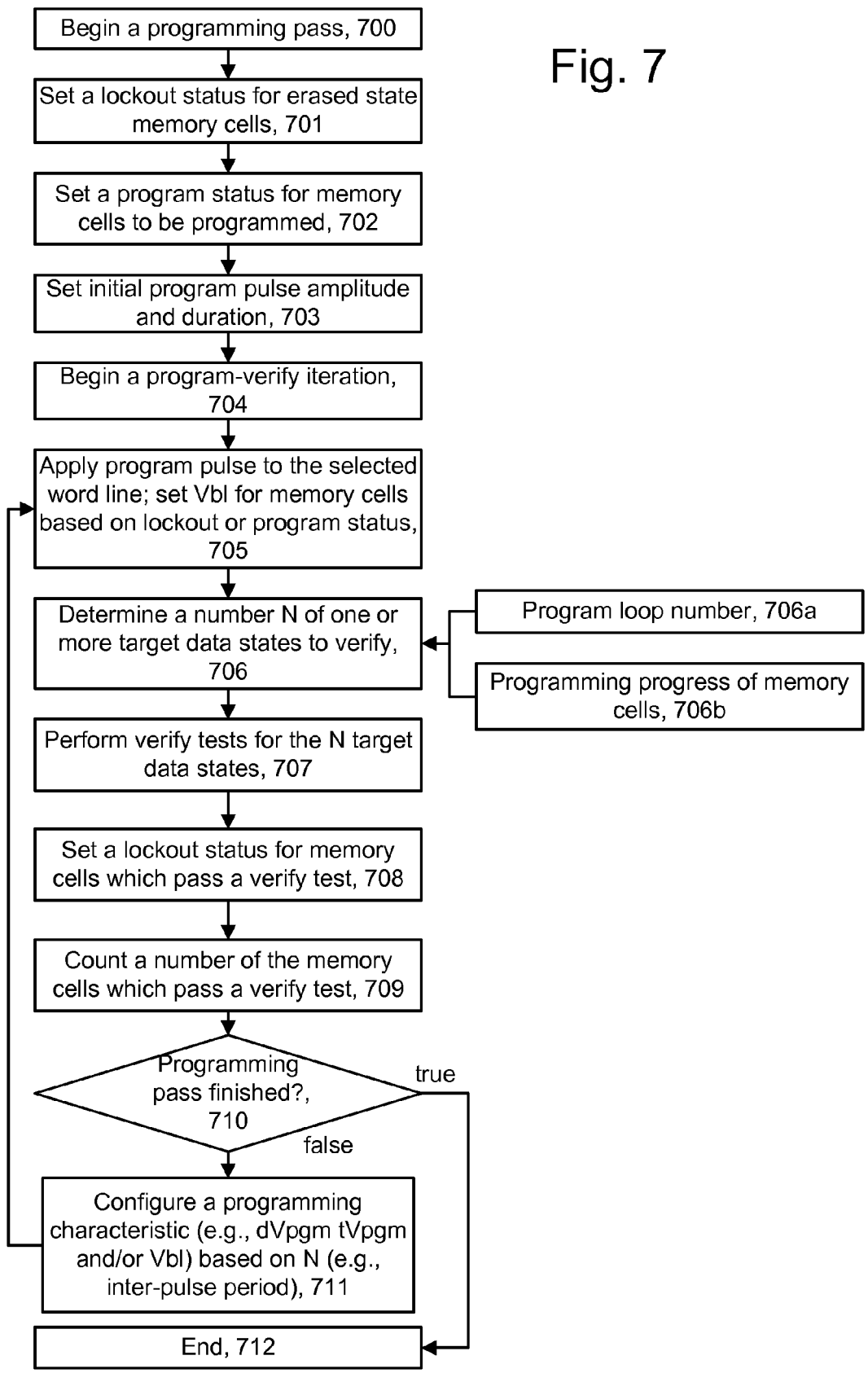

MODIFYING PROGRAM PULSES BASED ON INTER-PULSE PERIOD TO REDUCE PROGRAM NOISE

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

SUMMARY

Techniques are provided for more accurately programming memory cells by reducing program noise caused by charge loss in a programming pass in which the number of verify tests varies in different program loops.

BRIEF DESCRIPTION OF THE DRAWINGS

Like-numbered elements refer to common components in the different figures.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C depicts an embodiment of a stack 376 showing a cross-sectional view of the portion 307 of FIG. 3A, along line 305.

FIG. 7 depicts a process for programming a set of memory cell with adjusting of a programming characteristic based on an inter-pulse period.

DETAILED DESCRIPTION

Figure 1A:
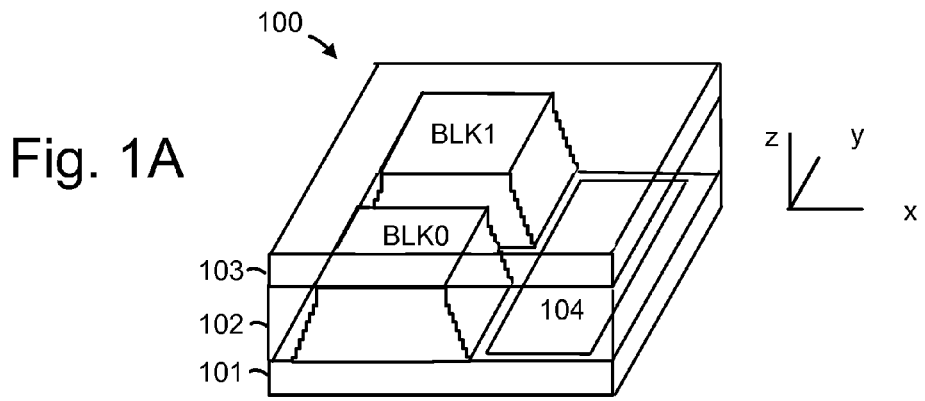
FIG. 1A is a perspective view of a 3D stacked non-volatile memory device.

Techniques are provided for more accurately programming memory cells by reducing the amount of program noise which is caused by charge loss.

The techniques are particularly suitable for use in a charge-trapping memory device which uses a charge-trapping material. In one approach, a silicon nitride layer is arranged between oxide layers (in an oxide-nitride-oxide or ONO configuration) next to a channel region. During programming, electrons move from the channel to the charge-trapping layer. See FIGS. 4C and 5C. However, a short-term charge loss occurs due to fast charge de-trapping from shallow traps in the ONO layers into the channel. This can occur in the time period between program pulses, e.g., the inter-pulse period, as a logarithmic function of time. This Vth drop (dVth) causes program noise σ(dVth) which is proportional dVth according to: σ(dVth)=[(qdVth)/Ccg]½ using a Poisson statistical distribution, where q is the electrical charge and Ccg is the capacitance of the control gate of the memory cell. Essentially, the jump in Vth due to each program pulse becomes larger than the program pulse step size due to the self-regulation effect of the memory cell. The self-regulation effect causes the memory cell to tend to move to a Vth level which is the sum of the highest previous Vth level and the program pulse step size. The larger jump in Vth results in a wider Vth distribution and especially an increase in the upper tail of the Vth distribution. Moreover, after programming is complete, the charge loss can result in a decrease in the lower tail of the Vth distribution. This is in conflict with the need to provide narrow Vth distributions to allow multiple data states to be accurately stored and read back.

A further issue is that the amount of program noise can be non-uniform during a program pass when the inter-pulse period varies. For example, the number of verify tests which occur between program pulses can vary as a function of the phase of the programming pass, in order to reduce the programming times by avoiding unnecessary verify tests. For example, during an early phase of the programming pass, verify tests can be performed for the lower target data states and during a later phase of the programming pass, verify tests can be performed for the higher target data states.

Techniques provided herein address the above-mentioned issues. Countermeasures are provided to reduce the non-uniformity of program noise throughout the programming pass. In one approach, when an nth program pulse is applied to a set of memory cells via a word line, at least one programming characteristic is modified based on the number (N) of data states which were subject to verify tests prior to the nth program pulse and after the n-1$^{st}$ program pulse. This number corresponds to an inter-pulse period, such that the period is larger when the number is larger. The modification of the at least one programming characteristic results in a slowdown of the programming of the memory cells. For example, a reduced step size or pulse duration, or an elevated bit line voltage can be used. These measures can be used in combination as well. A reduced step size or pulse duration slows down programming at selected times in a programming pass for all memory cells, while an elevated bit line voltage slows down programming at selected times in a programming pass for memory cells of one or more selected target data states. By slowing down programming at selected times, the program noise can be reduced, resulting in narrower Vth distributions. Moreover, since the slowdown is limited to selected times in a programming pass, an increase in the total programming time is minimized.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
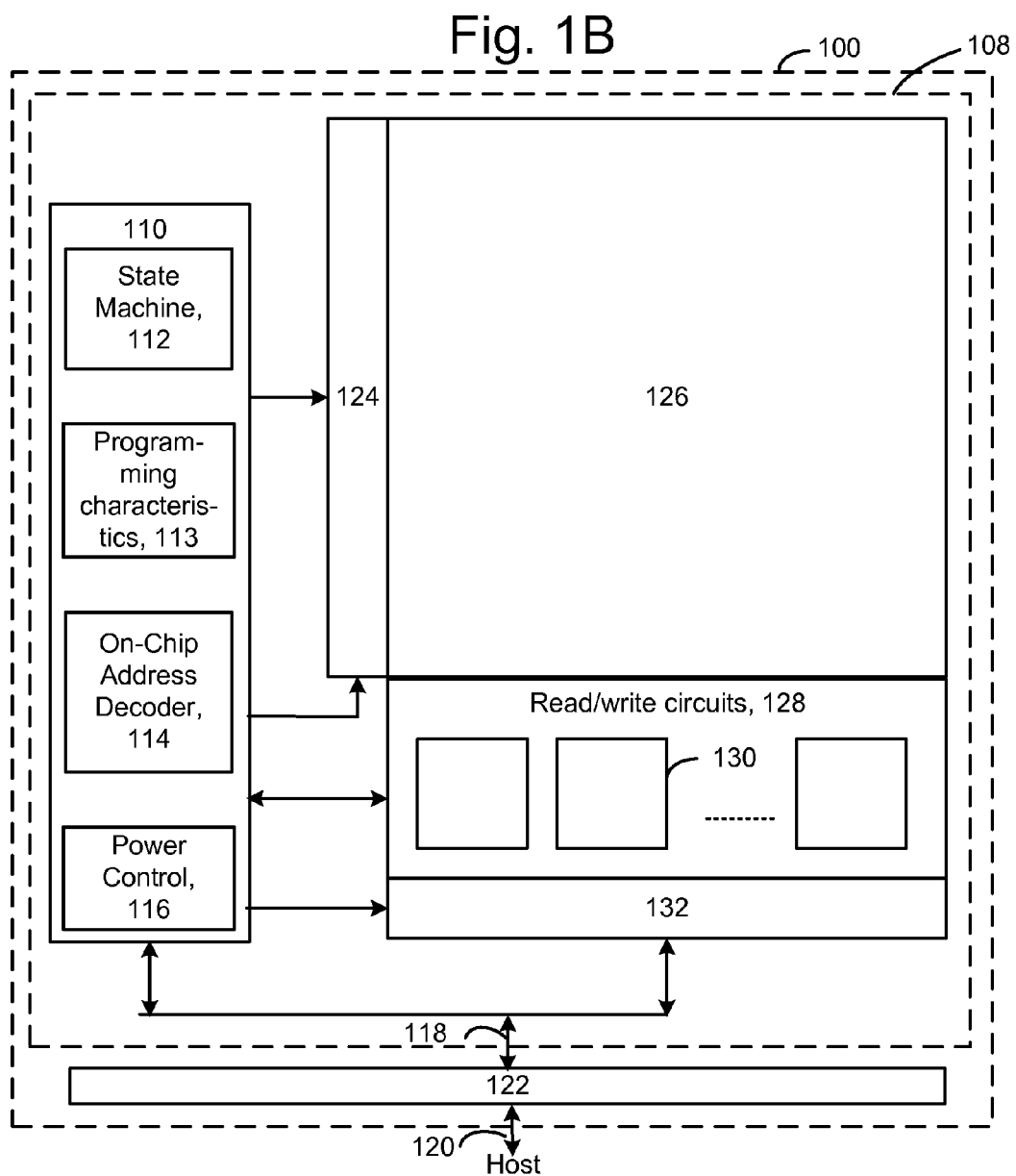
FIG. 1B is a functional block diagram of a memory device such as the 3D stacked non-volatile memory device 100 of FIG. 1A or a 2D memory device such as depicted in FIG. 5A to 5C.
Figure 5A:
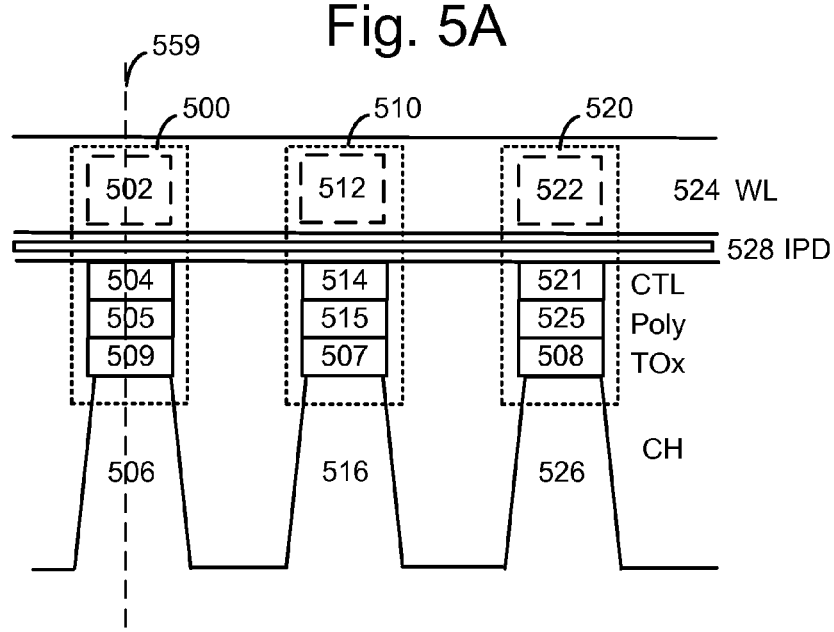
FIG. 5A depicts a cross-sectional view in a word line direction of memory cells comprising a flat control gate and charge-trapping regions as a 2D example of memory cells in the memory structure 126 of FIG. 1B.
Figure 5B:
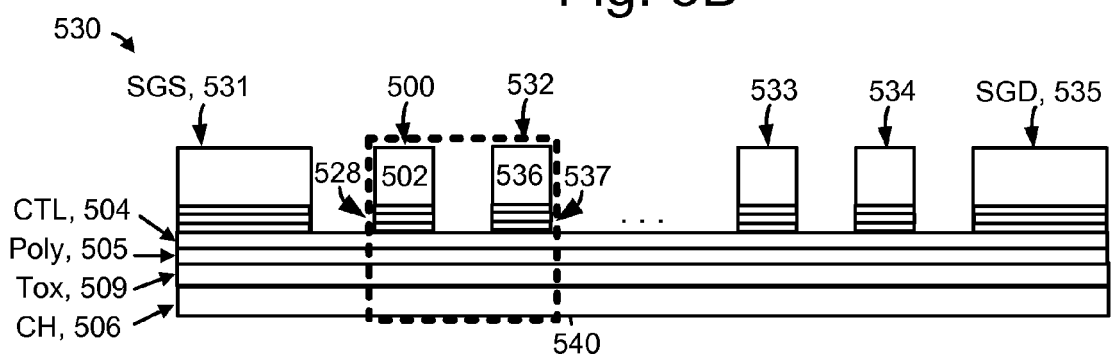
FIG. 5B depicts a cross sectional view along line 559 in FIG. 5A, showing a NAND string 530 having a flat control gate and a charge-trapping layer.
Figure 5C:
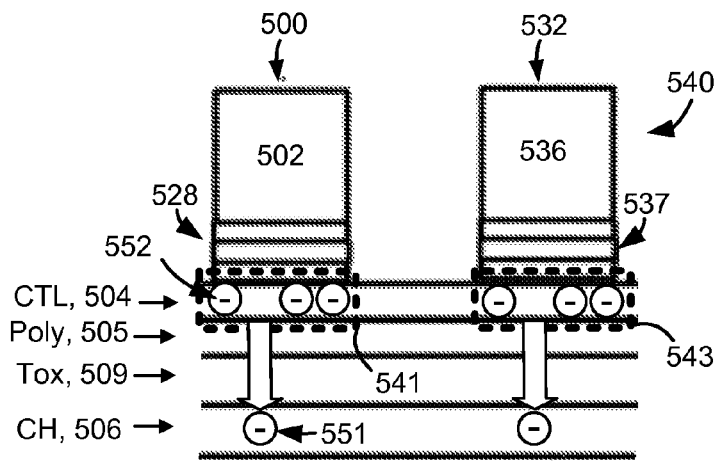
FIG. 5C depicts an expanded view of a portion 540 of the NAND string of FIG. 5B.

FIG. 1B is a functional block diagram of a memory device such as the 3D stacked non-volatile memory device 100 of FIG. 1A or a 2D memory device such as depicted in FIG. 5A to 5C. The memory device 100 may include one or more memory die 108. The memory die 108 includes a memory structure 126 of memory cells, such as an array of cells, control circuitry 110, and read/write circuits 128. In a 3D configuration, the memory array can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The memory structure may comprise one or more array of memory cells including a 3D array. The memory structure may comprise a monolithic three dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for programming characteristics in the memory device, such as an initial Vpgm, program pulse step sizes, program pulse durations and bit line voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end (SE) of a NAND string, and an SGD transistor is a select gate transistor at a drain end (DE) of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes.

Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
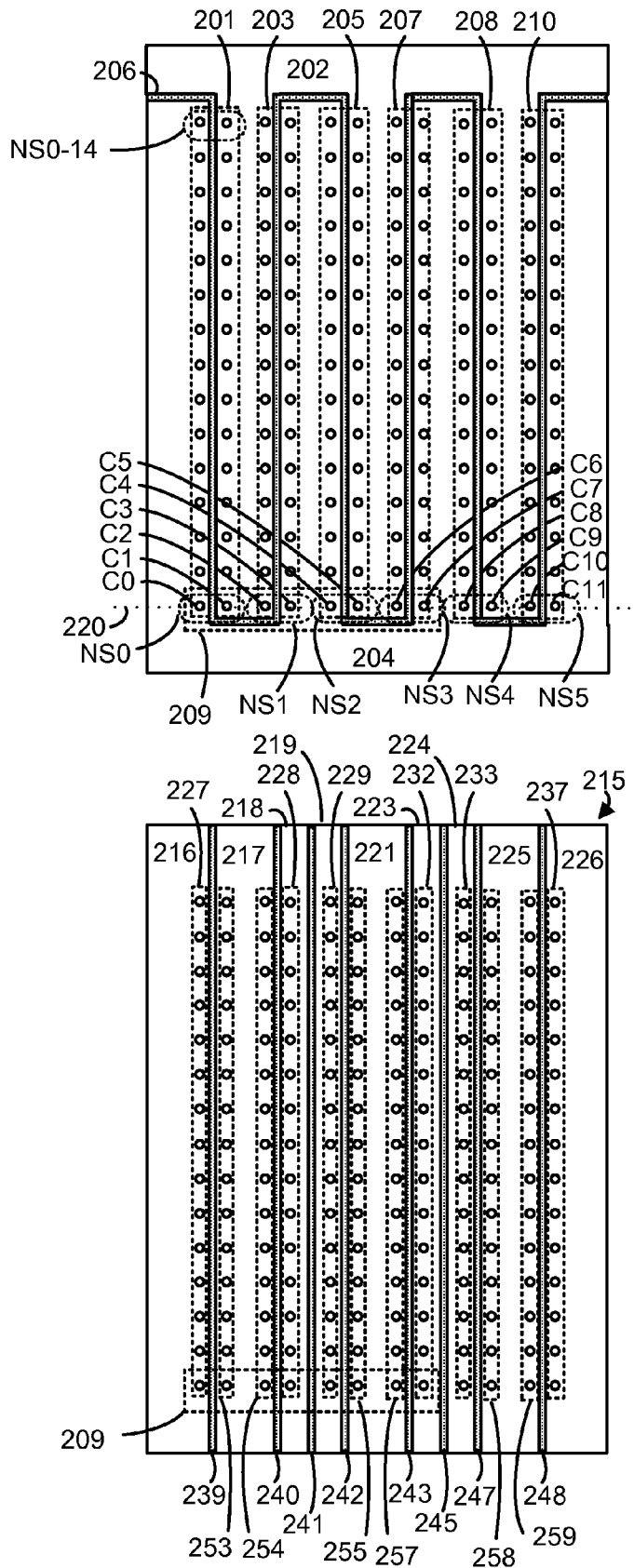
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

Figure 2C:
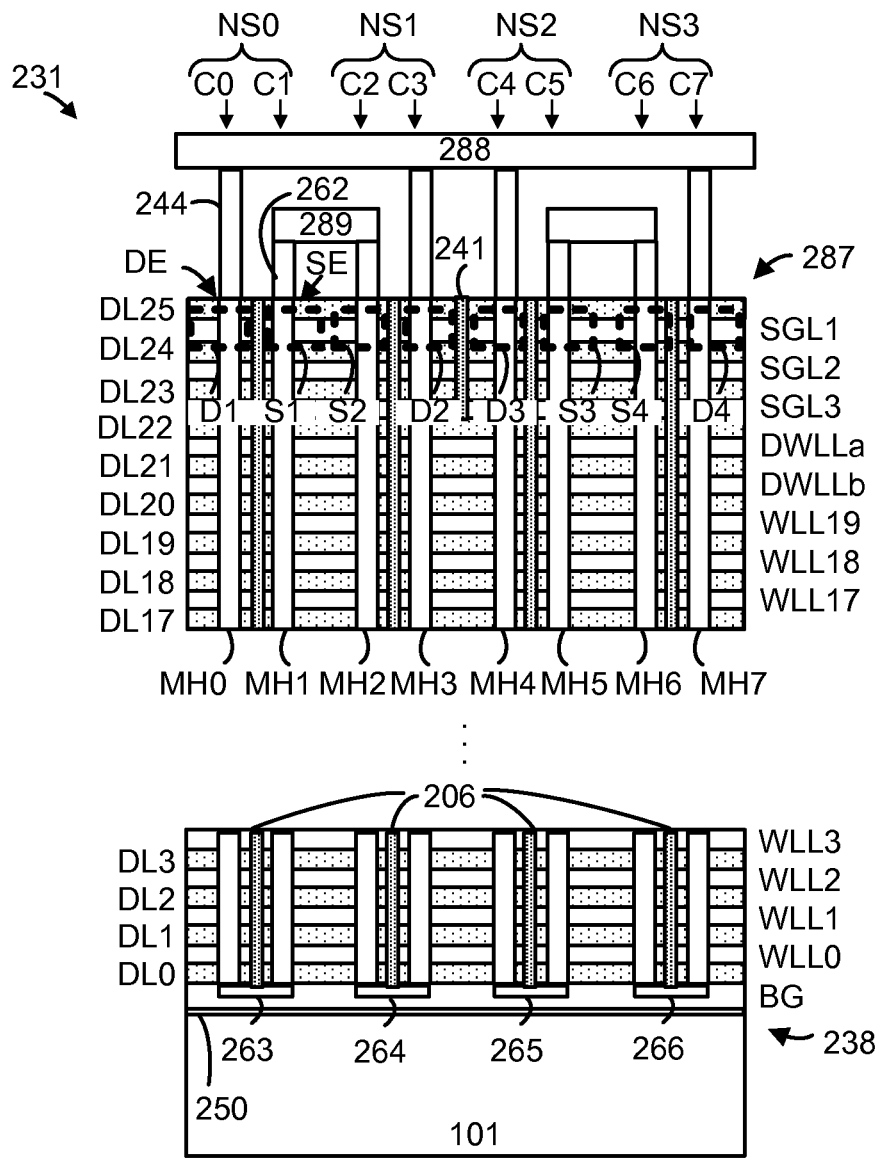
FIG. 2C depicts an embodiment of a stack 231 showing a cross-sectional view of the portion 209 of FIG. 2A, along line 220.

The view is of a representative layer among the multiple WLLs in a stack. Referring also to FIG. 2C, the stack includes alternating dielectric and conductive layers. The dielectric layers include DL0 to DL25 and may be made of $SiO_2$, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32,000 memory columns in the x direction, for a total of 384,000 memory columns in a block. With U-shaped NAND strings, 192,000 NAND strings are provided in this example. With straight NAND strings, 384,000 NAND strings are provided in this example. Assuming there are twenty-four memory cells per column, there are 384,000×24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220. This example includes three select gate layers, SGL1, SGL2 and SGL3. In this case, the slit extends down to DL22, so that three separate layers of select gate transistors are formed in each column of each NAND string. The stack has a top 287 and a bottom 238. Memory holes MH0-MH7 are also shown. An insulating film 250 on the substrate is shown.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors, in SGL1.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C.

Regions 340, 341, 342, 343, 344 and 345 represent the memory cells (as circles) of respective sets of NAND strings. For example, region 340 represents memory cells in NAND strings NS0A, NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C depicts an embodiment of a stack 376 showing a cross-sectional view of the portion 307 of FIG. 3A, along line 305. In this example, three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL22, and dielectric layers, e.g., DL0-DL27, are arranged alternatingly in the stack. SGS transistors SGS1$a$, SGS1$b$, SGS1$c$ and SGS1$d$ are formed in the SGS1 layer. Regions SGD1$a$, SGD1$b$, SGD1$c$ and SGD1$d$ represent SGD transistors. SGD layers SGD1, SGD2 and SGD3 and SGS layers SGS1, SGS2 and SGS3 are also shown.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string.

Figure 4A:
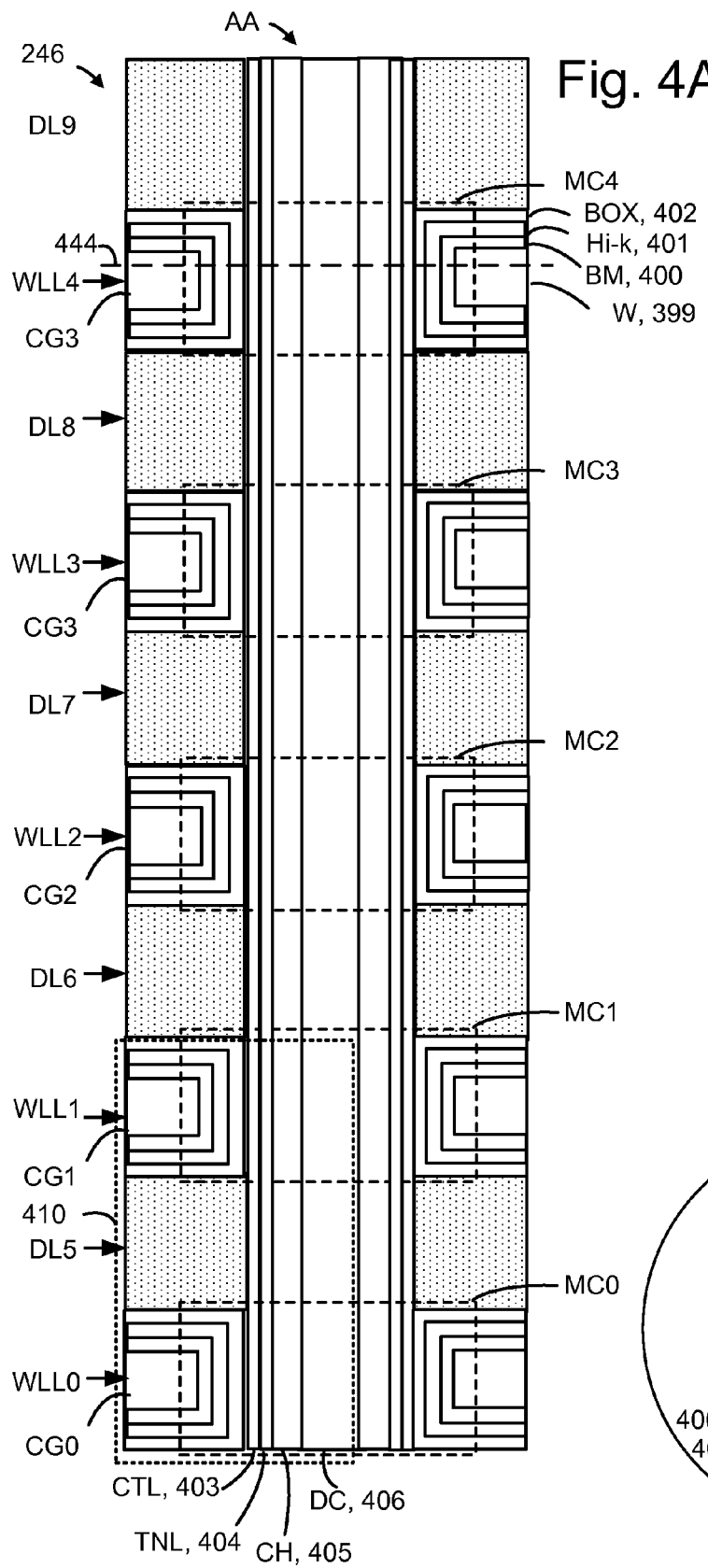
FIG. 4A depicts a view of the region 246 of FIG. 3C, showing memory cells MC1 to MC5.

A region 246 of the stack is shown in greater detail in FIG. 4A.

FIG. 4A depicts a view of the region 246 of FIG. 3C, showing memory cells MC1 to MC4. A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunnel oxide (TNL) 404, a polysilicon body or channel (CH) 405, and a dielectric core (DC) 406. A word line layer includes a block oxide (BOX) 402, a block high-k material 401, a barrier metal (BM) 400, and a conductive metal such as W 399 as the control gate. For example, control gates CG0, CG1, CG2, CG3 and CG4 are provided for the memory cells MC0, MC1, MC2, MC3 and MC4, respectively. In another approach, all of these layers except the metal are provided in the column. Additional memory cells are similarly formed throughout the columns. The layers in the memory hole form a columnar active area (AA) of the NAND string.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge. During an erase operation, the electrons return to the channel.

Each of the memory holes can be filled with a plurality of annular layers comprising a block oxide layer, a charge-trapping layer, a tunneling layer and a channel layer. A core region of each of the memory holes is filled with a body material, and the plurality of annular layers are between the core region and the WLLs in each of the memory holes.

Figure 4B:
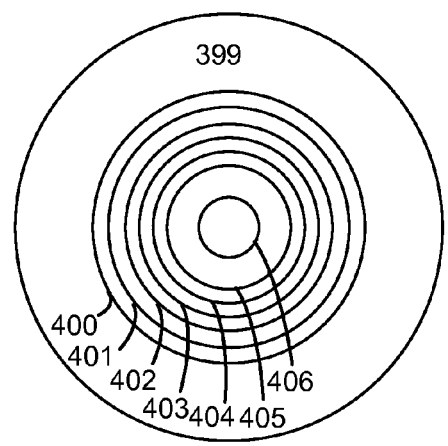
FIG. 4B depicts a cross-section view of the region 246 of FIG. 4A along line 444.

FIG. 4B depicts a cross-section view of the region 246 of FIG. 4A along line 444. Each layer is ring-shaped in one possible approach, except the core filler, which is a cylinder.

Figure 4C:
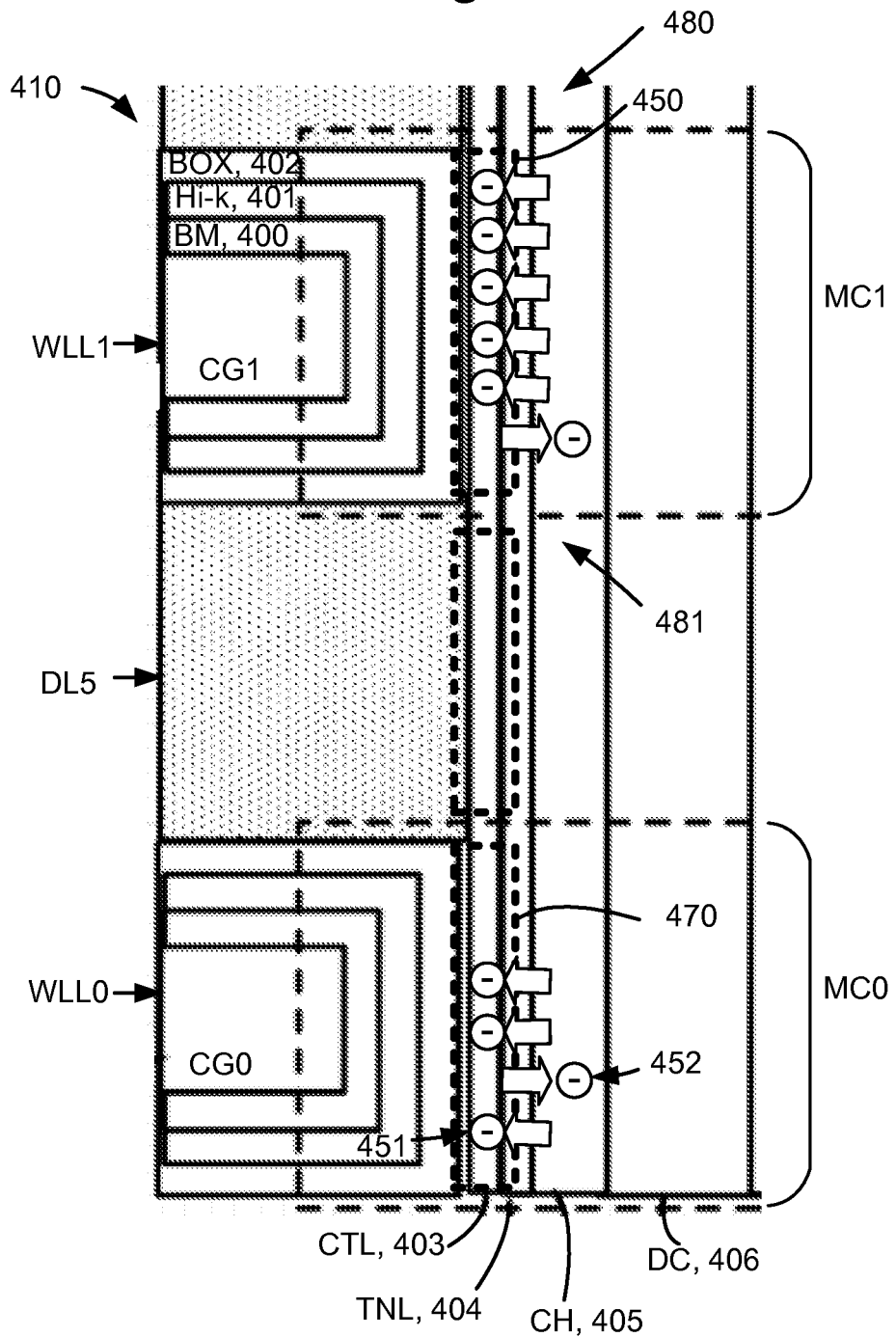
FIG. 4C depicts an expanded view of a portion 410 of the NAND string of FIG. 4A.

FIG. 4C depicts an expanded view of a portion 410 of the NAND string of FIG. 4A. When a program pulse (e.g., voltage) is applied to the control gate of a memory cell via a respective word line, an electric field is generated. In MC0, the electric field causes electrons to tunnel into a region 470 of the charge-trapping layer 403, from the channel 405. Similarly, for MC1, the electric field causes electrons to tunnel into a region 450 of the charge-trapping layer 403, from the channel 405. The movement of the electrons into the charge-trapping layer is represented by the arrows which point to the left. The electrons are represented by circles with a dash inside the circle.

When a memory cell on a selected word line is subsequently read back, control gate read voltages such as VreadA, VreadB and VreadC (FIG. 6A) are applied to the memory cell while sensing circuitry determines whether the memory cell is in a conductive state. At the same time, a read pass voltage, Vread (e.g., 8-9 V), is applied to the remaining word lines.

However, as mentioned at the outset, the accuracy of the programming can be impaired by charge loss in the memory cells. Charge loss is represented by the arrows which point to the right. For example, an electron 452 is an example of a charge which has de-trapped from the charge-trapping region 470, lowering the Vth of MC0. An electron 451 is an example of a charge which remains in the charge-trapping region 470.

MC1 has a drain 480, a source 481 and a control gate CG1.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel oxide (TOx) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

FIG. 5B depicts a cross sectional view along line 559 in FIG. 5A, showing a NAND string 530 having a flat control gate and a charge-trapping layer. The NAND string 530 includes an SGS transistor 531, example storage elements 500, 532, . . . , 533 and 534, and an SGD transistor 535. The memory cell 500 includes the control gate 502 and an IPD portion 528 above the charge-trapping layer 504, the polysilicon layer 505, the tunnel oxide layer 509 and the channel region 506. The memory cell 532 includes a control gate 536 and an IPD portion 537 above the charge-trapping layer 504, the polysilicon layer 505, the tunnel oxide layer 509 and the channel region 506.

The control gate layer may be polysilicon and the tunnel oxide layer may be silicon oxide, for instance. The IPD layer can be a stack of high-k dielectrics such as AlOx or HfOx which help increase the coupling ratio between the control gate layer and the charge-trapping or charge storing layer. The charge-trap layer can be a mix of silicon nitride and oxide, for instance. A difference between a floating gate memory cell and the flat memory cell is the height of the charge storage layer. A typically floating gate height may be about 100 nm, while a charge-trap layer can be as small as 3 nm, and the polysilicon layer can be about 5 nm. The SGD and SGS transistors have the same configuration as the storage elements but with a longer channel length to ensure that current is cutoff in an inhibited NAND string.

FIG. 5C depicts an expanded view of a portion 540 of the NAND string of FIG. 5B. The charge-trapping layer 504 includes regions 541 and 543 which are directly under and adjacent to the memory cells 500 and 532, respectively.

Charge loss can occur in a 2D memory device in a similar way as in the 3D memory device. Charge loss is represented by the arrows which point downward. For example, an electron 551 is an example of a charge which has de-trapped from the charge-trapping region 541, lowering the Vth of the memory cell 500. An electron 552 is an example of a charge which remains in the charge-trapping region 541. While charge loss is more pronounced in charge-trapping memory devices it can occur as well in floating gate memory devices. Accordingly, the techniques provided herein are also applicable to floating gate memory devices.

Figure 6A:
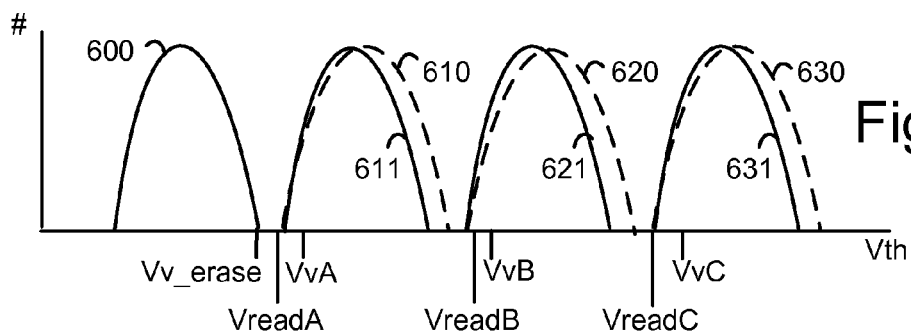
FIG. 6A depicts example Vth distributions after completion of a programming pass.

FIG. 6A depicts example Vth distributions after completion of a programming pass. During programming, program pulses are applied to the memory cells until all or most of the programmed memory cells pass a verify test. An example programming pass causes the memory cells to transition from the erased state (which has a verify voltage of Vv erase) to a target data state of A, B or C.

For example, the verify tests for the A, B and C states may uses verify voltages VvA, VvB and VvC, respectively. During a verify test, a verify voltage for a target data state is applied to a word line and sensing circuitry determines whether the memory cells of the target data state are in a non-conductive state. If a memory cell is in the non-conductive state, its Vth exceeds the verify voltage and it passes the verify test. If a memory cell is in the conductive state, its Vth is below the verify voltage and it fails the verify test. When a cell passes a verify test, it is locked out from programming for a remainder of the programming pass such as by elevating an associated bit line voltage during subsequent program pulses of the programming pass.

When a memory cell on a selected word line is subsequently read back, control gate read voltages such as VreadA, VreadB and VreadC are applied to the memory cell while sensing circuitry determine whether the memory cell is in a conductive state. At the same time, a read pass voltage, Vread (e.g., 8-9 V), is applied to the remaining word lines.

The Vth distribution 600 represents the erased (E) state, and the Vth distributions 610, 620 and 630 represent the A state, the B state and the C state, respectively, in a case where a programming characteristic is not adjusted based on the inter-pulse period. The Vth distributions 611, 621 and 631 represent the A state, the B state and the C state, respectively, in a case where a programming characteristic is adjusted based on the inter-pulse period. As can be seen, the Vth distributions are narrower, and the upper tails of the Vth distributions are lower when a programming characteristic is adjusted based on the inter-pulse period. The Vth distributions include a portion which is below the verify levels due to charge loss which occurs after a memory cell is locked out.

The A, B and C states are examples of programmed states in a four level memory device. Additional states can be used as well. For example, eight level and sixteen level memory devices have been proposed.

Figure 6B:
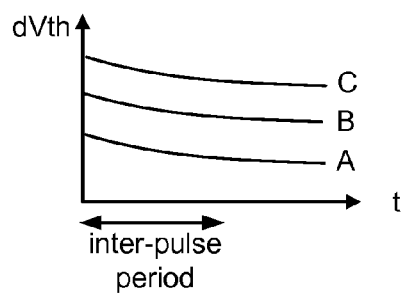
FIG. 6B depicts a plot of a decrease in Vth for memory cells of different data states versus time due to charge loss.

FIG. 6B depicts a plot of a decrease in Vth (dVth) for memory cells of different data states versus time due to charge loss. An example inter-pulse period is also depicted. Due to the nonlinear (e.g., logarithmic) nature of the charge loss, a substantial portion of the charge loss occurs immediately after a program pulse is applied. There is a relatively large decrease initially follow by a more gradual decrease. The charge loss results in a decrease in the Vth. The rate of charge loss is expected to be similar for memory cells of different data states. However, it is possible that the charge-loss depends on the data state, in which case the program characteristic can be adjusted based on the data state. See FIGS. 8C and 9C.

Figure 6C:
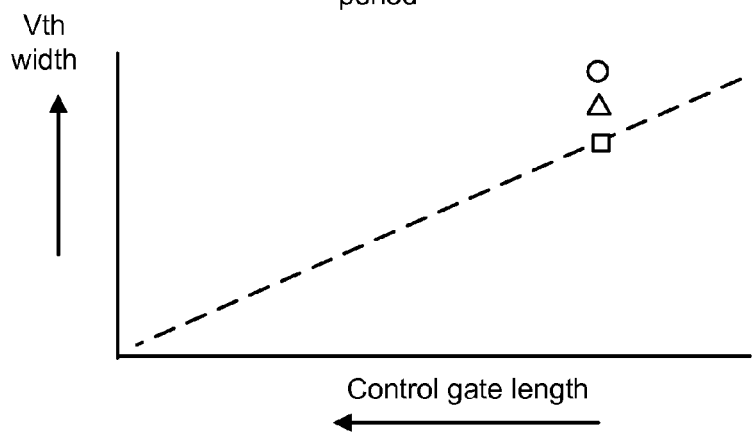
FIG. 6C depicts a plot of a Vth width versus control gate length, showing an increase in the Vth width as the control gate length becomes smaller.

FIG. 6C depicts a plot of a Vth width versus control gate length, showing an increase in the Vth width as the control gate length becomes smaller. The Vth width represents the program noise σ(dVth), discussed previously, for an example target data state. The units of Vth width is millivolts. The units of control gate length is $(Lg)^{-1/2}$ $(nm)^{-1/2}$, where Lg is the control gate length and nm denotes nanometers. The dashed line represents a straight line which is fitted to data obtained from 2D flash memory devices. The square symbol (□) represents an expected value of Vth width for an example 3D charge-trapping memory device based on its control gate length. The circle symbol (○) represents an actual value of Vth width for the example 3D charge-trapping memory device for a case of not adjusting a programming characteristic based on an inter-pulse period. The triangle symbol (Δ) represents an actual value of Vth width for the example 3D charge-trapping memory device for a case of adjusting a programming characteristic based on an inter-pulse period. A conclusion is that adjusting a programming characteristic based on an inter-pulse period advantageously reduces the Vth width, closer to the Vth width of a floating gate memory cell, which tends to have a less severe charge loss than a charge-trapping memory cell.

Figure 6D:
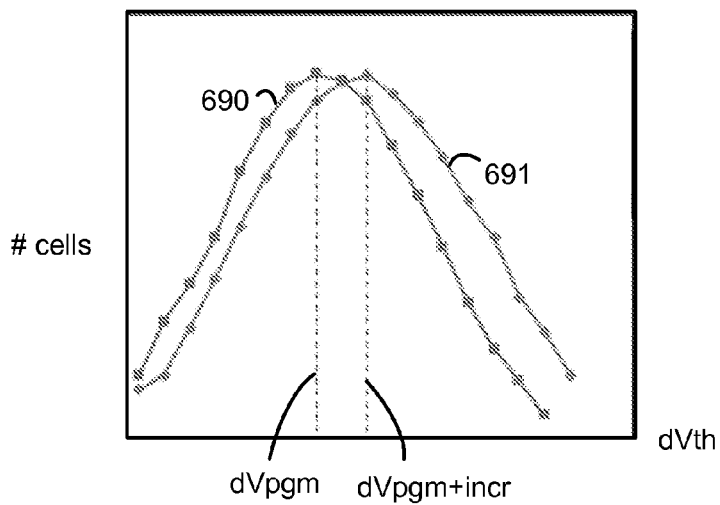
FIG. 6D depicts a plot showing a distribution of an increase in Vth (dVth) with and without adjusting of a programming characteristic based on an inter-pulse period (plots 690 and 691, respectively).

FIG. 6D depicts a plot showing a distribution of an increase in Vth (dVth) with and without adjusting of a programming characteristic based on an inter-pulse period (plots 690 and 691, respectively). As mentioned at the outset, program noise is larger when the Vth increases with each program pulse by an amount which is greater than the step size of the program pulse due to charge loss. This is demonstrated by the plot 691 which shows that the increase in Vth is centered at dVpgm+ incr, where incr. is an increment about the step size (dVpgm). In contrast, by adjusting a programming characteristic based on an inter-pulse period (plot 690), the increase in Vth is centered at the step size (dVpgm) so that program noise is reduced.

FIG. 7 depicts a process for programming a set of memory cell with adjusting of a programming characteristic based on an inter-pulse period. A programming pass begins at step 700. A programming operation can include one or more programming passes, in which case accuracy is typically most important on the final programming pass. A programming characteristic can therefore be adjusted based on the inter-pulse period during the final programming pass of a multi-pass programming operation. The programming can involve a set of memory cells which are connected to a selected word line. See FIG. 15. Step 701 sets a lockout status for erased state memory cells, e.g., cells which are to remain in the erased state. Step 702 sets a program status for memory cells which are to be programmed to a respective target data state. For example, the lockout or program status can be set in latches (e.g., in sensing circuitry 1400, FIG. 14) which are associated with each memory cell to be programmed. For example, the lockout status can be set by a bit sequence of 111 in the latches.

The program status can be set by setting a bit code for a target data state. For example, the A, B and C states can be set by bit codes of 001, 000 and 010, respectively, in the latches.

Step 703 sets an initial program pulse amplitude (Vpgm_init) and duration.

A program-verify iteration (e.g., program loop) begins at step 704. In a program portion of the program-verify iteration, a program pulse is applied to the selected word line while a bit line voltage (Vbl) is set for the memory cells based on the lockout or program status (step 705). Step 706 determines a number N of one or more target data states to verify. In one approach, at step 706a, N is set based on the program loop number. For example, during lower program loops numbers, verify tests can be performed for the lower target data states and during higher program loops numbers, verify tests can be performed for the higher target data states. During midrange program loops numbers, verify tests can be performed for the midrange target data states and possibly the lower and/or upper target data states as well.

Examples are provided in connection with FIGS. 8A, 9A, 10, 11A and 12A. This approach can predetermine the states for which verify tests are performed as a function of program loop number. In another approach, at step 706b, N is set based on a programming progress of the memory cells. For example, the lowest target state cells (e.g., A state cells) can be verified in the initial program loops until a specified portion of the A state cells have a Vth which exceeds a threshold (e.g., VvA), at which time verification can begin for the next lowest state cells (the B state cells), while continuing for a remainder of the A state cells, and so forth. This approach can adaptively set the states for which verify tests are performed as a function of programming progress. By skipping verify tests when they are not needed, the programming time can be reduced.

A hybrid process is possible as well in which a change in the states for which verify tests are performed can be triggered by a predetermined loop number or the programming progress. In one example, the lowest target state cells can be verified in the initial program loops until a specified portion (e.g., 50%) of the A state cells have a Vth which exceeds a threshold (e.g., VvA), or until a third program loop is reached, whichever comes first, at which time verification can begin for the next lowest state cells.

At step 707, verify tests are performed for the N target data states. A verify test can be performed by sensing whether a cell is in a conductive state while a verify voltage is applied to a control gate of the cell via a selected word line. In one approach, a sensing operation is performed for all memory cells and a result of the sensing operation is used only for the memory cells whose target data state is consistent with the target data state which is tested by the verify voltage. The result of the sensing operation can be discarded for the memory cells whose target data state is not consistent with the target data state which is tested by the verify voltage. For example, sensing can be performed for A, B and C state cells while VvA is applied to the word line, and the sensing result used only for the A state cells. Sensing can then be performed for A, B and C state cells while VvB is applied to the word line, and the sensing result used only for the B state cells. Sensing can then be performed for A, B and C state cells while VvC is applied to the word line, and the sensing result used only for the C state cells.

Step 708 sets a lockout status for memory cells which pass a verify test. Step 709 involves counting a number of the memory cells which pass a verify test. Decision step 710 determines if the programming pass is finished. The programming pass is finished if all or a specified portion, e.g., 95%, of the memory cells have passed a verify test. If decision step 710 is true, the programming pass ends at step 712. If decision step 710 is false, step 711 configures one or more programming characteristics based on N, e.g., based on the most recent inter-pulse period. For instance, the programming characteristic can be the program pulse step size (dVpgm), the program pulse duration (tVpgm) and/or Vbl. Various examples are provided below.

Figure 8A:
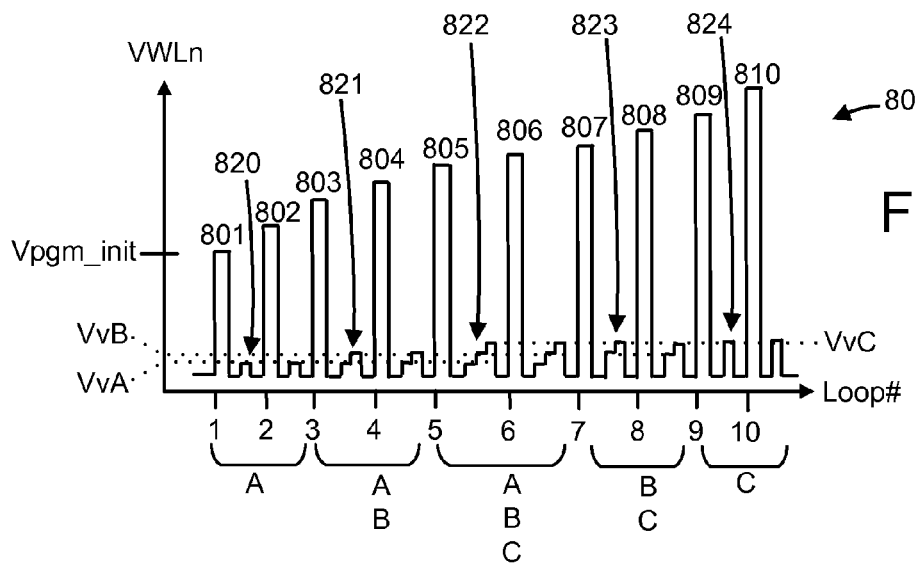
FIG. 8A depicts voltages applied to a word line in a programming pass, consistent with the process of FIG. 7, where the program pulses have a variable step size and a fixed duration, and there are three target data states.

FIG. 8A depicts voltages applied to a word line in a programming pass, consistent with the process of FIG. 7, where the program pulses have a variable step size and a fixed duration, and there are three target data states. In FIGS. 8A, 9A, 10, 11A and 12A, the horizontal axis depicts time, or a number of program loops or program-verify iterations, and the vertical axis depicts voltage on a selected word line, VWLn, or otherwise on control gates of memory cells. The programming pass comprises a waveform 800 which is applied to a selected word line. The waveform comprises program pulses 801-810 and verify voltages. Incremental step pulse programming (ISPP) is performed in which a program pulse increases by a step size in each program loop after the first program loop. A program pulse refers generally to a voltage waveform which can have one or more levels. The program pulses in this example are depicted as having a single peak level for simplicity. These program pulses typically rise from a starting level (e.g., 0 V) to the peak level and return to the starting level. Another example of a program pulse rises to an intermediate level, between 0 V and the peak level, then to the peak level and then returns to 0 V.

This example performs verify tests based on the program loop. For example, the A state cells are verified in loops 1 and 2, the A and B state cells are verified in loops 3 and 4, the A, B and C state cells are verified in loops 5 and 6, the B and C state cells are verified in loops 7 and 8 and the C state cells are verified in loops 9 and 10. In other words, the A state cells are verified in loops 1-6, the B state cells are verified in loops 3-8 and the C state cells are verified in loops 5-10.

One or more verify tests are performed after each program pulse as indicated by the one or more verify voltages after each program pulse. For example, a verify voltage 820 has a level of VvA (indicating a verify test for the A state), verify voltages 821 have levels of VvA and VvB (indicating verify tests for the A and B states), verify voltages 822 have levels of VvA, VvB and VvC (indicating verify tests for the A, B and C states), verify voltages 823 have levels of VvB and VvC (indicating verify tests for the B and C), and a verify voltage 824 has a level of VvC (indicating a verify test for the C state). The number of target data states for which the verify tests in one program-verify iteration are performed is relatively lower when the one program-verify iteration is at a start or end of the programming pass than when the one program-verify iteration is at a midpoint of the programming pass.

For example, to perform one program-verify iteration (e.g., program loop 5) of a plurality of program-verify iterations (program loops 1-10), a control circuit applies one program pulse 805 to a set of memory cells followed by performance of verify tests for a number of target data states (A and B) of the plurality of target data states. The number (N=2) of target data states for which the verify tests in the one program-verify iteration are performed is one or more but is fewer than all of the target data states (3 states). Further, after the one program-verify iteration, to perform another program-verify iteration (e.g., program loop 6) of the plurality of program-verify iterations, the control circuit applies another program pulse 806 to the set of memory cells followed by performance of verify tests for a number (N=3) of target data states of the plurality of target data states. At least one characteristic of the another program pulse is a function of a time between the one program pulse and the another program pulse.

Figure 8B:
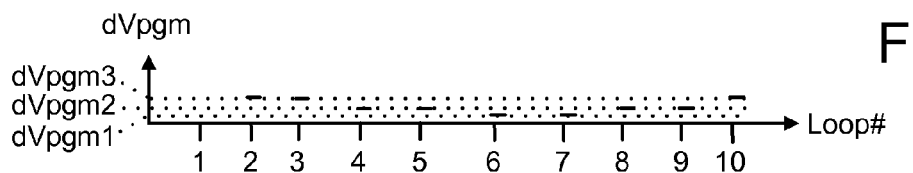
FIG. 8B depicts a plot of one example of a program pulse step size (dVpgm) versus loop number for use in FIG. 8A.

FIG. 8B depicts a plot of one example of a program pulse step size (dVpgm) versus loop number for use in FIG. 8A. A largest step size dVpgm3 is used for program pulses 802 and 803 which are applied after the smallest inter-pulse period, e.g., where one verify test is performed (for the A state). Thus, the step size is inversely proportional to the inter-pulse period and N. Next, a medium step size dVpgm2 is used for program pulses 804 and 805 which are applied after the medium inter-pulse period, e.g., where two verify tests are performed (for the A and B states). Next, a lowest step size dVpgm1 is used for program pulses 806 and 807 which are applied after the largest inter-pulse period, e.g., where three verify tests are performed (for the A, B and C states). Next, dVpgm2 is used for program pulses 808 and 809 which are applied after the medium inter-pulse period, e.g., where two verify tests are performed (for the B and C states). Finally, dVpgm3 is used for program pulse 810 which is applied after the smallest inter-pulse period, e.g., where one verify test is performed (for the C state).

Figure 8C:
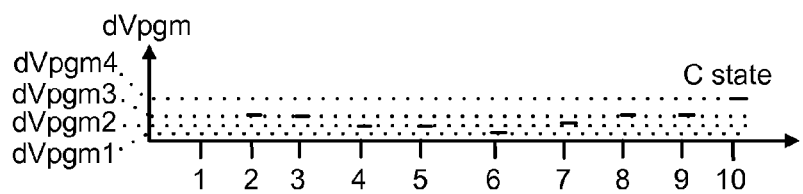
FIG. 8C depicts a plot of another example of a program pulse step size (dVpgm) versus loop number for use in FIG. 8A, where a step size dVpgm4 is specific to the C state.

FIG. 8C depicts a plot of another example of a program pulse step size (dVpgm) versus loop number for use in FIG. 8A, where a step size dVpgm4 is specific to the C state. In the example of FIG. 8B, the step size of a program pulse was a function of the inter-pulse period but was independent of a target data state. In this example, a new largest step size dVpgm4 is used when the C state cells are being programmed by themselves (e.g., by program pulse 810), such as might occur at the end of the programming pass when cells of other target data states are all locked out. This new largest step size may be useful, e.g., in completing the programming of the hardest to program C state cells. In another example of data state dependence, the step size for program pulses 804 and 805 (in which one pair of states is verified: the A and B states) can be different than the step size for program pulses 806 and 807 (in which another pair of states is verified: the B and C states). For example, it may be desirable to use a larger step size when the higher pair of states (the B and C states) are being verified than when the lower pair of states (the A and B states) are being verified. A program characteristic which is in effect during a program pulse can depend on the data state or states which were verified in the program loop before the program pulse and/or the program loop of the program pulse.

Figure 12A:
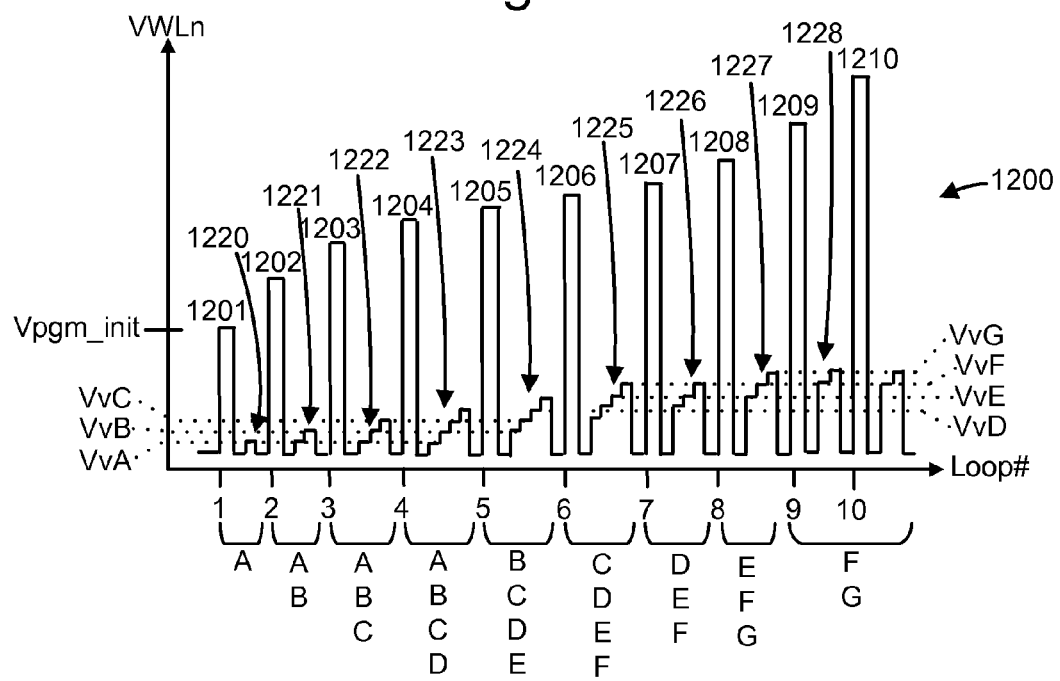
FIG. 12A depicts voltages applied to a word line in a programming pass, consistent with the process of FIG. 7, where the program pulses have a variable step size and a fixed duration, and there are seven target data states.
Figure 12B:
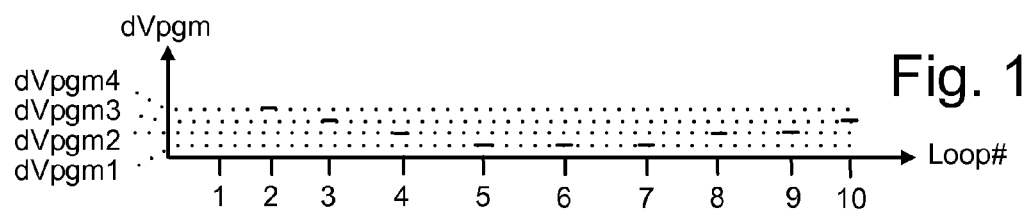
FIG. 12B depicts a plot of one example of a program pulse step size (dVpgm) versus loop number for use in FIG. 12A.

In a further example, see FIGS. 12A and 12B, where there are seven target data states. In this case, for instance, it may be desirable to use a larger step size when a higher set of three states (the D, E and F states) are being verified than when a lower set of three states (the A, B and C states) are being verified.

Figure 8D:
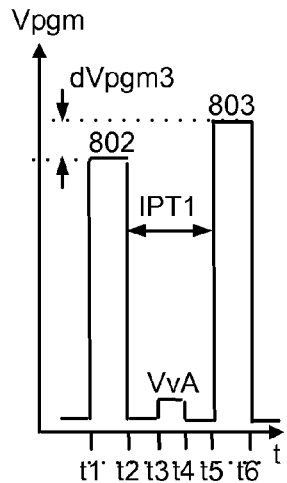
FIG. 8D depicts a timing between program pulses 802 and 803 from FIG. 8A, showing one verify voltage between the program pulses.

FIG. 8D depicts a timing between program pulses 802 and 803 from FIG. 8A, showing one verify voltage between the program pulses. A horizontal axis depicts time and a vertical axis depicts voltage (Vpgm). IPT1 is an inter-pulse time between the successive pulses 802 and 803, e.g., a time between the end of the pulse 802 and the start of the pulse 803, when charge loss occurs. Charge loss generally does not occur while a program pulse is applied. The inter-pulse time is proportional to the number of verify voltages. dVpgm3 is the step size. A time period t1-t2 is used to apply the program pulse 802, and a time period t2-t3 is used to allow the word line voltage to reach 0 V and stabilize after the program pulse 802, and to activate the sensing circuitry in anticipation of the verify voltage at VvA. Pass voltages can also be set on the unselected word line from t2-t3. The time period t3-t4 is used for VvA. The time period t4-t3 is used to allow the selected and unselected word line voltages to reach 0 V and stabilize and to prepare for the program pulse 803 such as by applying pass voltages to the unselected word lines and setting Vbl. The program pulse 803 is applied in the time period t5-t6. The time periods are not necessarily to scale.

Figure 8E:
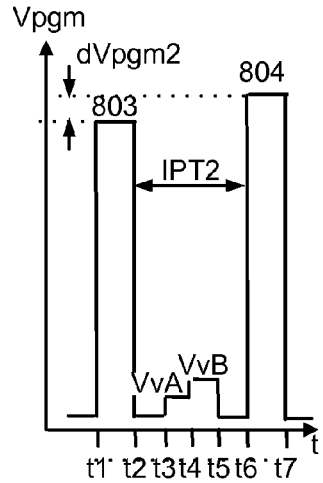
FIG. 8E depicts a timing between program pulses 803 and 804 from FIG. 8A, showing two verify voltages between the program pulses.

FIG. 8E depicts a timing between program pulses 803 and 804 from FIG. 8A, showing two verify voltages between the program pulses. IPT2 is an inter-pulse time between the successive pulses 803 and 804. dVpgm2 is the step size. The time period t1-t2 is used to apply the program pulse 803, the time period t3-t4 is used for VvA, the time period t4-t5 is used for VvB, and the time period t6-t7 is used for the program pulse 804.

Figure 8F:
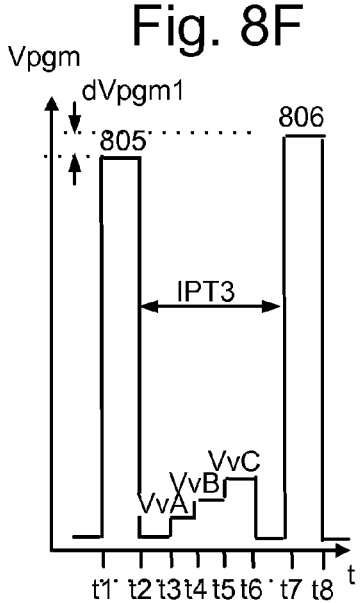
FIG. 8F depicts a timing between program pulses 805 and 806 from FIG. 8A, showing three verify voltages between the program pulses.

FIG. 8F depicts a timing between program pulses 805 and 806 from FIG. 8A, showing three verify voltages between the program pulses. IPT3 is an inter-pulse time between the successive pulses 805 and 806. dVpgm1 is the step size. The time period t1-t2 is used to apply the program pulse 803, the time period t3-t4 is used for VvA, the time period t4-t5 is used for VvB, the time period t5-t6 is used for VvC, and the time period t7-t8 is used for the program pulse 806.

Figure 9A:
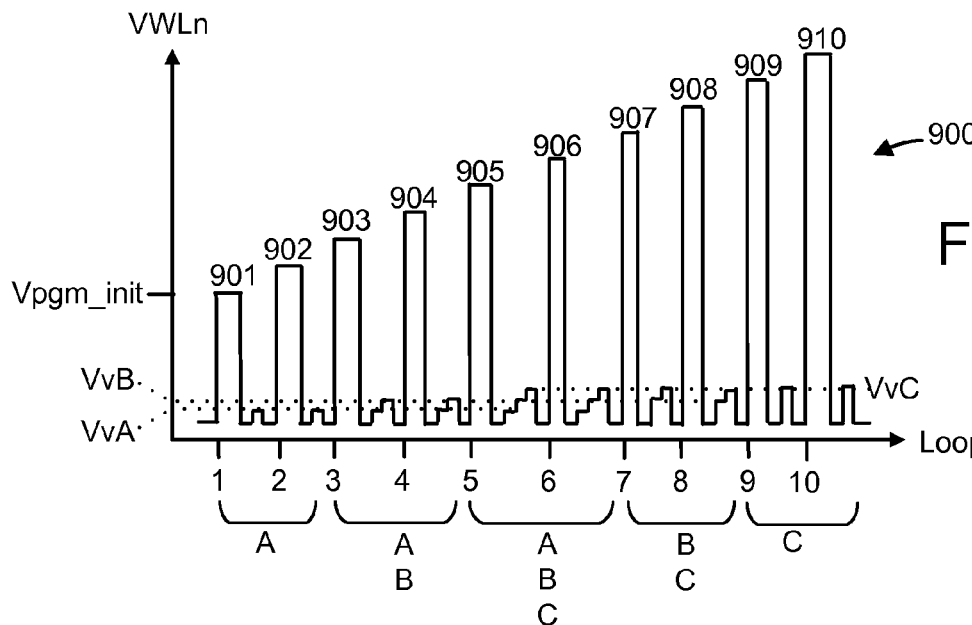
FIG. 9A depicts voltages applied to a word line in a programming pass, consistent with the process of FIG. 7, where the program pulses have a fixed step size and a variable duration.

FIG. 9A depicts voltages (VWLn) applied to a word line in a programming pass, consistent with the process of FIG. 7, where the program pulses have a fixed step size and a variable duration or width. The programming pass comprises a waveform 900 which is applied to a selected word line. The waveform comprises program pulses 901-910 and verify voltages. This example performs verify tests based on the program loop as in FIG. 8A and the verify voltages are the same as in FIG. 8A.

Figure 9B:
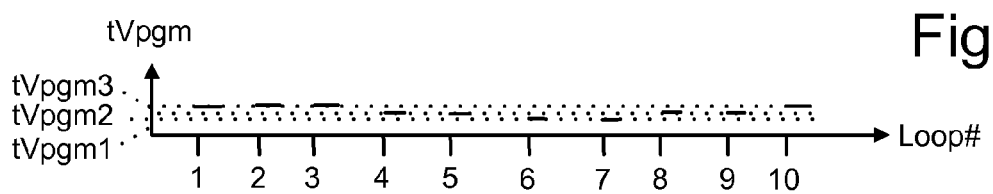
FIG. 9B depicts a plot of one example of a program pulse duration (tVpgm) versus loop number for use in FIG. 9A.

FIG. 9B depicts a plot of one example of a program pulse duration (tVpgm) versus loop number for use in FIG. 9A. A largest duration tVpgm3 is used for program pulses 902 and 903. Program pulse 903 is applied after the smallest inter-pulse period, e.g., where one verify test is performed (for the A state). Thus, the duration is inversely proportional to the inter-pulse period. Next, a medium duration tVpgm2 is used for program pulses 904 and 905 which are applied after the medium inter-pulse period, e.g., where two verify tests are performed (for the A and B states). Next, a lowest duration tVpgm1 is used for program pulses 906 and 907 which are applied after the largest inter-pulse period, e.g., where three verify tests are performed (for the A, B and C states). Next, tVpgm2 is used for program pulses 908 and 909 which are applied after the medium inter-pulse period, e.g., where two verify tests are performed (for the B and C states). Finally, the largest duration tVpgm3 is used for program pulse 910 which is applied after the smallest inter-pulse period, e.g., where one verify test is performed (for the C state).

Figure 9C:
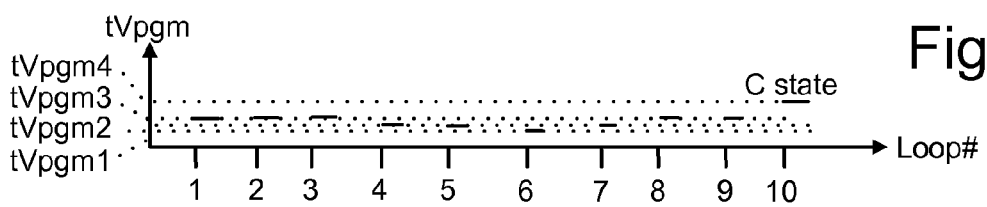
FIG. 9C depicts a plot of another example of a program pulse duration (tVpgm) versus loop number for use in FIG. 9A, where a program pulse duration tVpgm4 is specific to the C state.

FIG. 9C depicts a plot of another example of a program pulse duration (tVpgm) versus loop number for use in FIG. 9A, where a program pulse duration tVpgm4 is specific to the C state. In the example of FIG. 9B, the program pulse duration was a function of the inter-pulse period but was independent of the target data state. In this example, a new largest duration tVpgm4 is used when the C state cells are being programmed by themselves, such as might occur at the end of the programming pass. This new largest duration may be useful in completing the programming of the hardest to program C state cells. Another example of a duration which depends on the target data state is to use a different tVpgm for the program pulse 902 which is applied in a program loop with an A state verify voltage than for the program pulse 910 which is applied in a program loop with a C state verify voltage. In another example of data state dependence, the duration for program pulses 904 and 905 (in which one pair of states is verified: the A and B states) can be different than the duration for program pulses 906 and 907 (in which another pair of states is verified: the B and C states). For example, it may be desirable to use a larger duration when the higher pair of states (the B and C states) are being verified than when the lower pair of states (the A and B states) are being verified.

Figure 10:
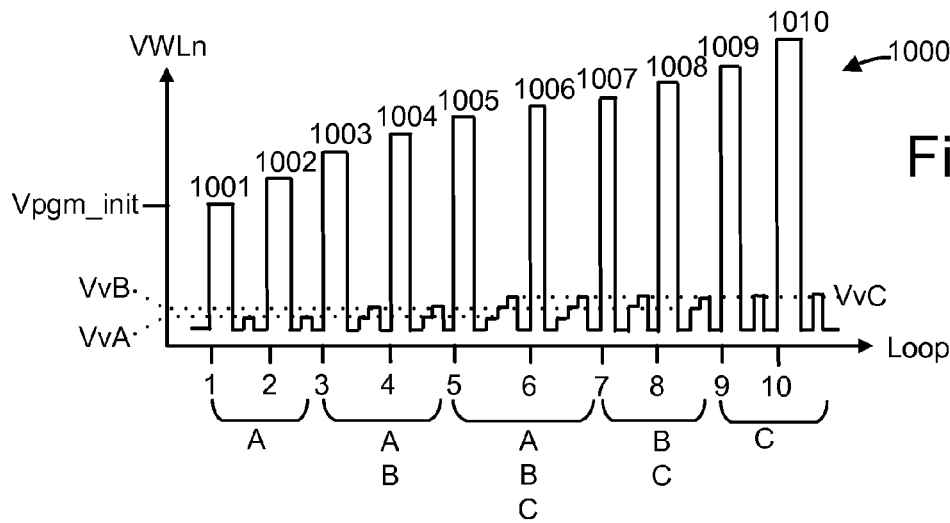
FIG. 10 depicts voltages applied to a word line in a programming pass, consistent with the process of FIG. 7, where the program pulses have a variable step size and a variable duration.

FIG. 10 depicts voltages applied to a word line in a programming pass, consistent with the process of FIG. 7, where the program pulses have a variable step size and a variable duration. This approach is a combination of the approaches of FIGS. 8A and 9A. The programming pass comprises a waveform 1000 which is applied to a selected word line. The waveform comprises program pulses 1001-1010 and verify voltages. This example performs verify tests based on the program loop as in FIG. 8A and the verify voltages are the same as in FIG. 8A. The program pulse step size can be varied as in FIG. 8B or 8C and the program pulse duration can be varied as in in FIG. 9B or 9C, for instance. An advantage of adjusting both the program pulse duration and width is that a wider range of adjustment to the programming speed is obtained. The range of adjustment can be increased further by adjusting Vbl.

Figure 11A:
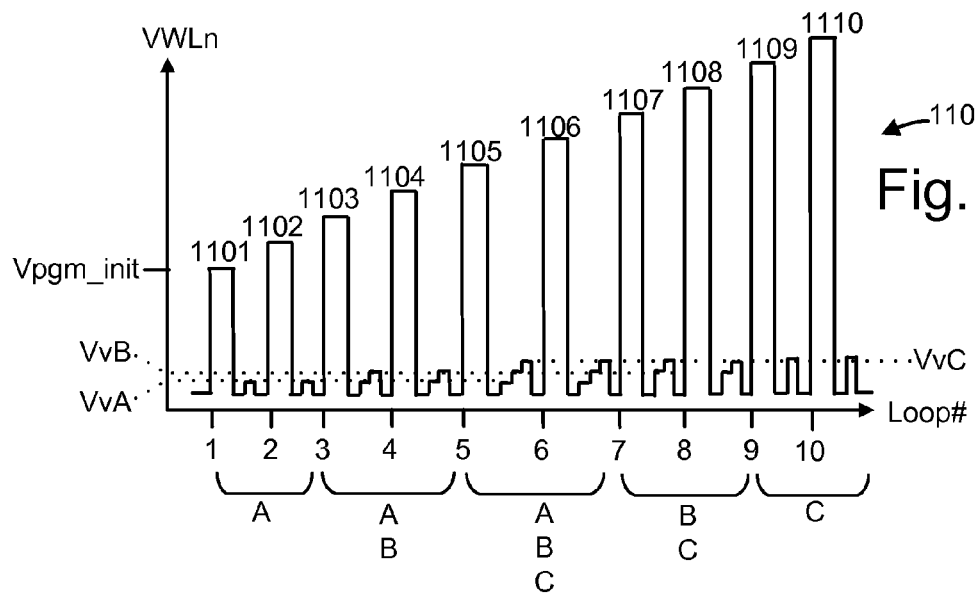
FIG. 11A depicts voltages applied to a word line in a programming pass, consistent with the process of FIG. 7, where the program pulses have a fixed step size and a fixed duration, and a variable bit line voltage is used.

FIG. 11A depicts voltages applied to a word line in a programming pass, consistent with the process of FIG. 7, where the program pulses have a fixed step size and a fixed duration, and a variable bit line voltage is used. The programming pass comprises a waveform 1100 which is applied to a selected word line. The waveform comprises program pulses 1101-1110 and verify voltages. This example performs verify tests based on the program loop as in FIG. 8A and the verify voltages are the same as in FIG. 8A. To adjust the programming speed as a function of the inter-pulse time, a bit line voltage (Vbl) can be elevated for memory cells for which the programming speed is to be slowed. Furthermore, Vbl can be relatively higher when the programming speed is to be relatively lower. The Vbl is still lower than a level (Vbl_inhibit) which inhibits programming, however. As an example, Vbl_inhibit may be 1.5-2 V and a Vbl which slows programming may be up to 1.0 V.

Figure 11B:
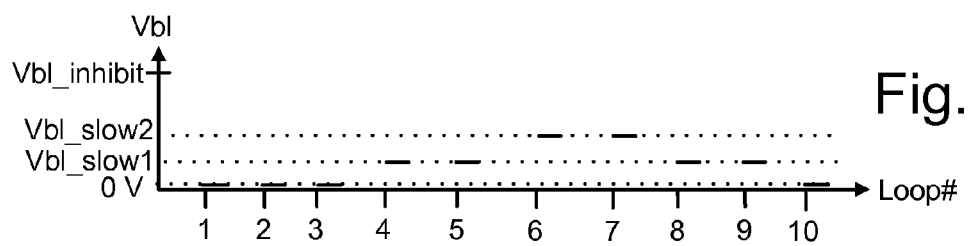
FIG. 11B depicts a plot of one example of a bit line voltage (Vbl) for use in FIG. 11A.

FIG. 11B depicts a plot of one example of a bit line voltage (Vbl) for use in FIG. 11A. A lowest Vbl, e.g., 0 V, is used for program pulses 1102 and 1103 which are applied after the smallest inter-pulse period, e.g., where one verify test is performed (for the A state). The lowest Vbl is also used for the initial program pulse 1101. Thus, Vbl is proportional to the inter-pulse period. Next, a medium amplitude bit line voltage, Vbl_slow1, is used for program pulses 1104 and 1105 which are applied after the medium inter-pulse period, e.g., where two verify tests are performed (for the A and B states). Next, a highest amplitude bit line voltage, Vbl_slow2, is used for program pulses 1106 and 1107 which are applied after the largest inter-pulse period, e.g., where three verify tests are performed (for the A, B and C states). Next, Vbl_slow1 is used for program pulses 1108 and 1109 which are applied after the medium inter-pulse period, e.g., where two verify tests are performed (for the B and C states). Finally, the lowest Vbl is used for program pulse 1110 which is applied after the smallest inter-pulse period, e.g., where one verify test is performed (for the C state). The elevated bit line voltages are or for the memory cells which have a program status. The memory cells which have a lockout status may receive Vbl_inhibit.

Optionally, a level of Vbl in a program loop can be used which depends on one or more target data states which are verified in the program loop, as discussed in connection with FIGS. 8C and 9C.

FIG. 12A depicts voltages applied to a word line in a programming pass, consistent with the process of FIG. 7, where the program pulses have a variable step size and a fixed duration, and there are seven target data states (A-G). The programming pass comprises a waveform 1200 which is applied to a selected word line. The waveform comprises program pulses 1201-1210 and verify voltages.

This example also performs verify tests based on the program loop. The association between loop number and the data state verified is as follows: loop 1: A; loop 2: A, B; loop 3: A, B, C; loop 4: A, B, C, D; loop 5: B, C, D, E; loop 6: C, D, E, F; loop 7: D, E, F; loop 8: E, F, G and loops 9 and 10: F and G. One or more verify tests are performed after each program pulse as indicated by the one or more verify voltages after each program pulse. For example, a verify voltage 1220 has a level of VvA, verify voltages 1221 have levels of VvA and VvB, verify voltages 1222 have levels of VvA, VvB and VvC, verify voltages 1223 have levels of VvA, VvB, VvC and VvD, verify voltages 1224 have levels of VvB, VvC, VvD and VvE, verify voltages 1225 have levels of VvC, VvD, VvE and VvF, verify voltages 1226 have levels of VvD, VvE and VvF, verify voltages 1227 have levels of VvE, VvF and VvG, and verify voltages 1228 have levels of VvF and VvG.

FIG. 12B depicts a plot of one example of a program pulse step size (dVpgm) versus loop number for use in FIG. 12A. A largest step size dVpgm4 is used for program pulse 1202 which is applied after an inter-pulse period with one verify test (for the A state). Next, a second largest step size dVpgm3b is used for program pulse 1203 which is applied after an inter-pulse period with two verify tests (for the A and B states). Next, a third largest step size dVpgm2b is used for program pulse 1204 which is applied after an inter-pulse period with three verify tests (for the A, B and C states). Next, a smallest step size dVpgm1 is used for program pulse 1205 which is applied after an inter-pulse period with four verify tests (for the A, B, C and D states). Next, the smallest step size dVpgm1 is used for program pulse 1206 which is applied after an inter-pulse period with four verify tests (for the B, C, D and E states). Next, the smallest step size dVpgm1 is used for program pulse 1207 which is applied after an inter-pulse period with four verify tests (for the C, D, E and F states). Next, the third largest step size dVpgm2b is used for program pulse 1208 which is applied after an inter-pulse period with three verify tests (for the D, E and F states). Next, the third largest step size dVpgm2b is used for program pulse 1209 which is applied after an inter-pulse period with three verify tests (for the E, F and G states). Next, the second largest step size dVpgm3b is used for program pulse 1210 which is applied after an inter-pulse period with two verify tests (for the F and G states).

It is also possible to vary the program pulse duration and/or Vbl, as discussed.

Figure 12C:
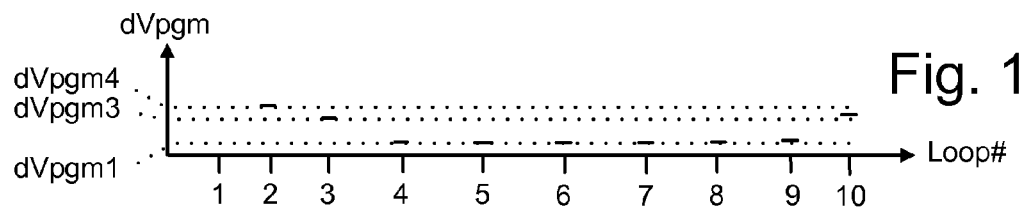
FIG. 12C depicts a plot of another example of a program pulse step size (dVpgm) versus loop number for use in FIG. 12A, as an alternative to FIG. 12B.

FIG. 12C depicts a plot of another example of a program pulse step size (dVpgm) versus loop number for use in FIG. 12A, as an alternative to FIG. 12B. In this example, the step size is set to dVpgm1 instead of dVpgm2b for the program loops 4, 8 and 9. This allows dVpgm2b to be omitted as a step size to reduce the implementation complexity. See also FIG. 13C.

It is also possible to provide a step size which is a function of one or more target data states such as discussed previously.

Figure 13A:
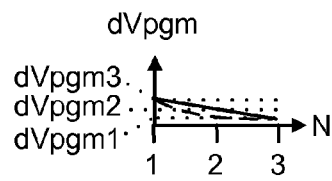
FIG. 13A depicts a plot of a program pulse step size as a linear or nonlinear function of a number of states verified (N), where N=1-3.
Figure 13B:
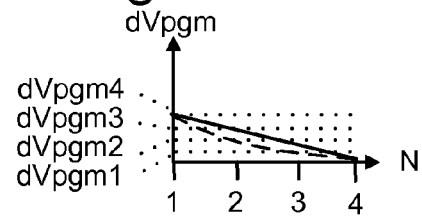
FIG. 13B depicts a plot of a program pulse step size as a linear or nonlinear function of a number of states verified (N), where N=1-4.
Figure 13C:
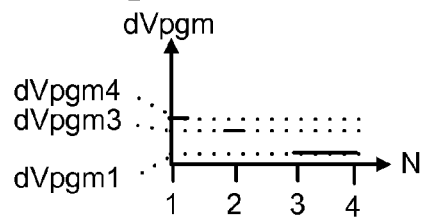
FIG. 13C depicts a plot of a program pulse step size as a linear function of a number of states verified (N), where N=1-4 and a common step size is used for similar values of N.

In FIG. 13A to 13C, the horizontal axis indicates the number (N) of states verified in a prior program loop (immediately before a program pulse of a current program loop) and the vertical axis indicates a program pulse step size which is added to the amplitude of the program pulse of the prior program loop to obtain the amplitude of the program pulse of the current program loop. In FIG. 13C, the vertical axis indicates a duration of the program pulse of the current program loop. In FIG. 13E to 13G, the vertical axis indicates a bit line voltage or use during the program pulse of the current program loop.

FIG. 13A depicts a plot of a program pulse step size as a linear or nonlinear function of a number of states verified (N), where N=1-3. The step sizes dVpgm1-dVpgm3 may be consistent with FIG. 8B, for example. Examples are provided in which the step size is a linear function (solid line) or a nonlinear function (dashed line) of N.

FIG. 13B depicts a plot of a program pulse step size as a linear or nonlinear function of a number of states verified (N), where N=1-4. The step sizes dVpgm1-dVpgm4 may be consistent with FIG. 12B, for example. Examples are provided in which the step size is a linear function (solid line) or a nonlinear function (dashed line) of N.

FIG. 13C depicts a plot of a program pulse step size as a linear function of a number of states verified (N), where N=1-4 and a common step size is used for similar values of N. The step sizes dVpgm1-dVpgm4 may be consistent with FIG. 12C, for example. In this example, dVpgm4 is used when N=1, dVpgm3 is used when N=2, and dVpgm1 is used when N=3 or 4. In other words, similar values of N (e.g., 3 and 4) which are expected to have a similar amount of inter-pulse charge loss can be treated the same in terms of a programming characteristic (e.g., step size) which addresses the inter-pulse charge loss. Charge loss is expected to be similar for higher values of N, while charge loss is expected to vary more quickly for lower values of N. As mentioned, this approach reduces the complexity of the implementation.

The relative amplitudes of the steps sizes are not necessarily to scale and a gap is depicted between dVpgm1 and dVpgm3 to show that a step size has been removed.

Figure 13D:
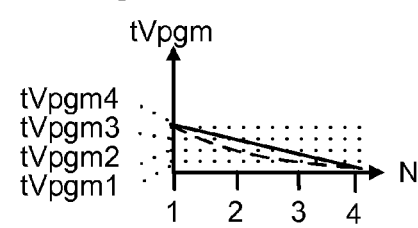
FIG. 13D depicts a plot of a program pulse duration as a linear or nonlinear function of a number of states verified (N), where N=1-4.
Figure 13E:
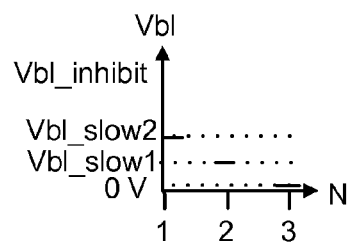
FIG. 13E depicts a plot of a bit line voltage as a function of a number of states verified, where there are three target data states, and a separate Vbl is used for each value of N.
Figure 13F:
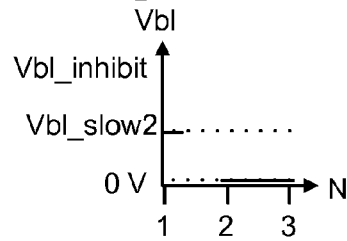
FIG. 13F depicts a plot of a bit line voltage as a function of a number of states verified, where there are three target data states, and a common Vbl is used for similar values of N.
Figure 13G:
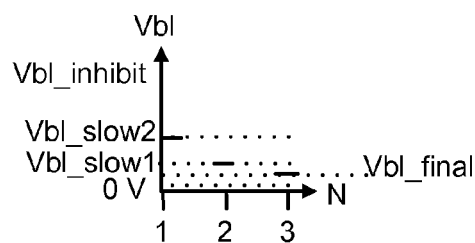
FIG. 13G depicts a plot of a bit line voltage as a function of a number of states verified, where there are three target data states, Vbl_slow2 is used for N=1, Vbl_slow1 is used for N=2, Vbl_slow is used for N=3, and Vbl_slow2>Vbl_slow1>Vbl_final.

FIG. 13D depicts a plot of a program pulse duration as a linear or nonlinear function of a number of states verified (N), where N=1-4. The program pulse durations tVpgm1-tVpgm4 may be consistent with FIG. 9C, for example. Examples are provided in which the step size is a linear function (solid line) or a nonlinear function (dashed line) of N.

FIG. 13E depicts a plot of a bit line voltage as a function of a number of states verified, where there are three target data states, and a separate Vbl is used for each value of N. The bit line voltages may be consistent with FIG. 11B, for example. Vbl_slow2, Vbl_slow1 and 0 V are provided for N=1, 2 or 3, respectively. This approach provides the greatest flexibility to adjust the programming speed (and the corresponding jump in Vth in response to a program pulse) to address program noise.

FIG. 13F depicts a plot of a bit line voltage as a function of a number of states verified, where there are three target data states, and a common Vbl is used for similar values of N. As an alternative to FIG. 13E, Vbl_slow2 is used when N=1 and 0 V is used when N=2 or 3. The relative amplitudes of Vbl are not necessarily to scale and a gap is depicted between 0 V and Vbl_slow2 to show that a level of Vbl has been removed. This provides a simplified implementation in that the number of levels of Vbl is minimized. This is also an example of providing a slowdown measure when N is relatively small (e.g., 1) and providing no slowdown measure when N is relatively large (e.g., 2 or 3).

In some programming techniques, Vbl is elevated above 0 V to slow down programming to achieve a narrower Vth distribution. For example, an initial programming pass may be performed in which the memory cells are programmed using a verify level which is offset below the final verify level. Referring to FIG. 6A, the offset verify levels may be VvA-offset, VvB-offset and VvC-offset. In this initial programming pass, Vbl may be set to 0 V to allow fast programming. In a final programming pass, the memory cells are programmed using the final verify levels of VvA, VvB and VvC, and Vbl may be set to an elevated level such as 0.5 V to provide slower programming. In this case, the elevated Vbl which addresses charge loss can be provided at a level which is above the level for the slower programming, as depicted in FIG. 13G.

FIG. 13G depicts a plot of a bit line voltage as a function of a number of states verified, where there are three target data states, Vbl_slow2 is used for N=1, Vbl_slow1 is used for N=2, Vbl_final is used for N=3, and Vbl_slow2>Vbl_slow1>Vbl_final. This approach provides a non-zero minimum Vbl to allow slow programming which narrows Vth distributions.

Figure 14:
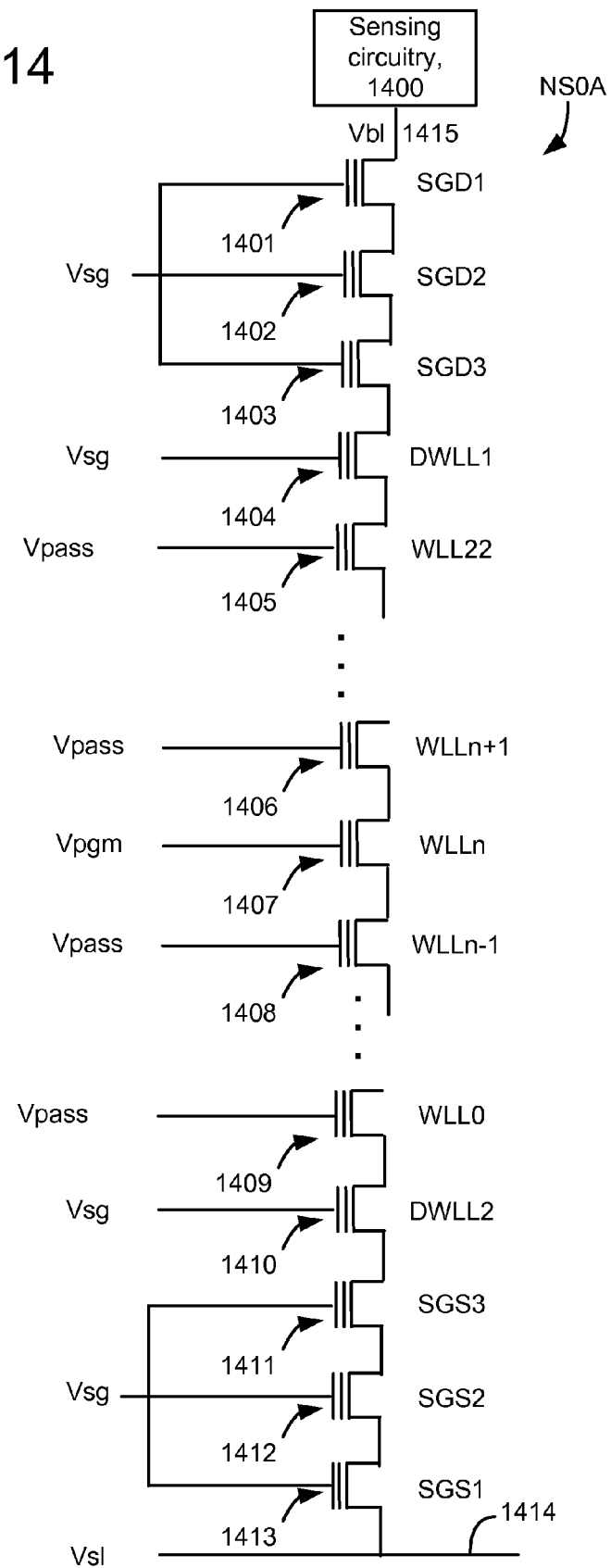
FIG. 14 depicts a circuit diagram of a NAND string consistent with the memory devices of FIGS. 2C, 3C and 5B.

FIG. 14 depicts a circuit diagram of a NAND string consistent with the memory devices of FIGS. 2C, 3C and 5B. An example NAND string NS0A includes SGD transistors 1401, 1402 and 1403, a drain-side dummy memory cell 1404, data-storing memory cells 1405, ..., 1406, 1407, 1408, ..., 1409, a source-side dummy memory cell 1410, and SGS transistors 1411, 1412 and 1413. A bit line 1415 connects the drain end of the NAND string to sensing circuitry 1400, which is used to sense the NAND string during operations involving the select gate transistors and the memory cells. A source line 1414 is connected to a source end of the NAND string. Voltage drivers can be used to provide the voltages depicted. For example, Vsg is applied to the control gates of the SGD transistors, which are connected to one another and to the control gates of the SGS transistors, which are connected to one another. Vsg can also be applied to the dummy memory cells 1404 and 1410. Vbl is the bit line voltage and Vsl is the source line voltage.

A similar circuit diagram can be provided for the NAND string 530 of FIG. 5B by omitting the extra select gate transistors and the dummy memory cells.

In this example, the memory cell 1407 is selected for programming and is connected to a selected word line WLLn which receives Vpgm. The memory cell 1408 is an adjacent, previously-programmed memory cell which is connected to a word line WLLn−1 which receives Vpass. The memory cell 1406 is an adjacent, later-programmed memory cell which is connected to a word line WLLn+1 which receives Vpass. The remaining word lines, which are not adjacent to WLLn, including WLL0 to WLLn−2 and WLLn+2 to WLL22, can also receive a pass voltage. In some cases, the pass voltage on the adjacent word lines of the selected word line is optimized separately from the pass voltages on non-adjacent word lines of the selected word line.

Various memory devices allow the control of a bit line voltage for a respective memory cell. For example, in a 3D memory device such as in FIG. 3A, the memory cells which are connected to one word line layer and to a common SGD line will be in different NAND strings, where each NAND string is connected to a separate bit line. In a 2D memory device such as in FIG. 5B, the memory cells which are connected to one word line will be in different NAND strings, where each NAND string is connected to a separate bit line.

Figure 15:
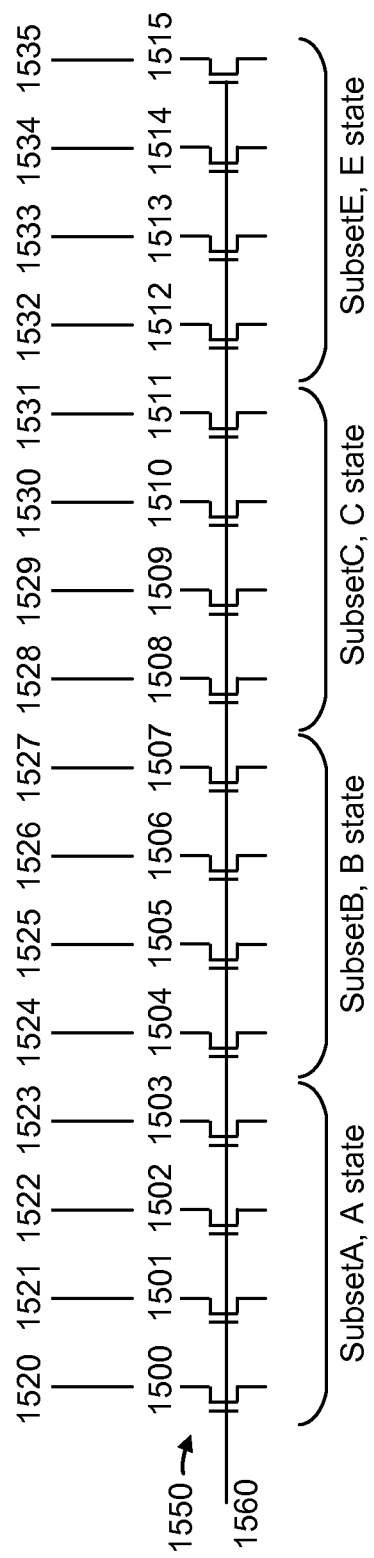
FIG. 15 depicts an example set of memory cells 1550, including memory cells 1500-1515 and associated bit lines 1520-1535, respectively.

FIG. 15 depicts an example set of memory cells 1550, including memory cells 1500-1515 and associated bit lines 1520-1535, respectively. In a simplified example, subsetA, subsetB and subsetC include memory cells with the A state, B state or C state, respectively, as the target data state, and subsetE includes memory cells in the E state. In practice, the data states are generally randomized among the cells. Each memory cell can be in a respective NAND string, for instance. The set of memory cells may be connected to a selected word line 1560.

Accordingly, it can be seen that, in one embodiment, a method for programming: performing one program-verify iteration of a plurality of program-verify iterations in a programming pass for a set of memory cells, the set of memory cells are to be programmed to a plurality of target data states in the programming pass, the performing the one program-verify iteration comprises performing programming of the set of memory cells followed by performing verify tests for a number of target data states of the plurality of target data states, wherein the number of target data states for which the verify tests in the one program-verify iteration are performed is one or more but is fewer than all of the target data states; and after the one program-verify iteration, performing another program-verify iteration of the plurality of program-verify iterations by performing programming of the set of memory cells followed by performing verify tests for a number of target data states of the plurality of target data states, wherein at least one characteristic of the programming of the set of memory cells in the another program-verify iteration is a function of the number of target data states for which the verify tests in the one program-verify iteration are performed.

In another embodiment, a memory device comprises: a set of memory cells, the set of memory cells are to be programmed to a plurality of target data states in a programming pass, the programming pass comprising a plurality of program-verify iterations; and a control circuit. The control circuit is configured to: to perform one program-verify iteration of the plurality of program-verify iterations, apply one program pulse to the set of memory cells followed by performance of verify tests for a number of target data states of the plurality of target data states, wherein the number of target data states for which the verify tests in the one program-verify iteration are performed is one or more but is fewer than all of the target data states, and after the one program-verify iteration, to perform another program-verify iteration of the plurality of program-verify iterations, apply another program pulse to the set of memory cells followed by performance of verify tests for a number of target data states of the plurality of target data states, wherein at least one characteristic of the another program pulse is a function of a time between the one program pulse and the another program pulse.

In another embodiment, a memory device comprises: a set of memory cells, the set of memory cells are to be programmed to a plurality of target data states in a programming pass; and a control circuit. The control circuit: applies one program pulse to the set of memory cells followed by performance of verify tests for a number of target data states of the plurality of target data states, wherein the number of target data states for which the verify tests are performed after the one program pulse is one or more but is fewer than all of the target data states, and applies another program pulse to the set of memory cells followed by performance of verify tests for a number of target data states of the plurality of target data states, wherein at least one characteristic of the another program pulse is a function of the number of target data states for which the verify tests are performed after the one program pulse.

In another embodiment, a memory device comprises: a set of memory cells, the set of memory cells are to be programmed to a plurality of target data states in a programming pass, the programming pass comprising a plurality of program-verify iterations; and a control circuit. The control circuit is configured to: perform one program-verify iteration of the plurality of program-verify iterations by performing programming of the set of memory cells followed by performing verify tests for a number of target data states of the plurality of target data states, wherein the number of target data states for which the verify tests in the one program-verify iteration are performed is one or more but is fewer than all of the target data states, and after the one program-verify iteration, perform another program-verify iteration of the plurality of program-verify iterations by performing programming of the set of memory cells followed by performing verify tests for a number of target data states of the plurality of target data states, wherein at least one characteristic of the programming of the set of memory cells in the another program-verify iteration is a function of the number of target data states for which the verify tests in the one program-verify iteration are performed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A memory device, comprising:
   a set of memory cells, the set of memory cells are to be programmed to a plurality of target data states in a programming pass, the programming pass comprising a plurality of program-verify iterations; and
   a control circuit, the control circuit is configured to:
      to perform one program-verify iteration of the plurality of program-verify iterations, apply one program pulse to the set of memory cells followed by performance of verify tests for a number of target data states of the plurality of target data states, wherein the number of target data states for which the verify tests in the one program-verify iteration are performed is one or more but is fewer than all of the target data states, and
      after the one program-verify iteration, to perform another program-verify iteration of the plurality of program-verify iterations, apply another program pulse to the set of memory cells followed by performance of verify tests for a number of target data states of the plurality of target data states, wherein at least one characteristic of the another program pulse is a function of a time between the one program pulse and the another program pulse.

2. The memory device of claim 1, wherein:
a time between a program pulse of the programming of the one program-verify iteration and a program pulse of the programming of the one program-verify iteration is relatively larger when the number of target data states for which the verify tests in the one program-verify iteration are performed is relatively larger.

3. The memory device of claim 1, wherein:
the at least one characteristic comprises a step size of the another program pulse; and
the step size is relatively smaller when the time is relatively larger.

4. The memory device of claim 1, wherein:
the at least one characteristic comprises a duration of the another program pulse; and
the duration is relatively smaller when the time is relatively larger.

5. The memory device of claim 1, wherein:
the at least one characteristic is a function of the target data states for which the verify tests in the another program-verify iteration are performed.

6. The memory device of claim 1, wherein:
the time is a function of a position of the one program-verify iteration in the programming pass.

7. The memory device of claim 6, wherein:
the time is relatively smaller when the one program-verify iteration is at a start of the programming pass than when the one program-verify iteration is at a midpoint of the programming pass.

8. The memory device of claim 6, wherein:
the set of memory cells comprises charge-trapping memory cells in a three-dimensional memory structure.

9. A memory device, comprising:
a set of memory cells, the set of memory cells are to be programmed to a plurality of target data states in a programming pass; and
a control circuit, the control circuit:
   applies one program pulse to the set of memory cells followed by performance of verify tests for a number of target data states of the plurality of target data states, wherein the number of target data states for which the verify tests are performed after the one program pulse is one or more but is fewer than all of the target data states, and
   applies another program pulse to the set of memory cells followed by performance of verify tests for a number of target data states of the plurality of target data states, wherein at least one characteristic of the another program pulse is a function of the number of target data states for which the verify tests are performed after the one program pulse.

10. The memory device of claim 9, wherein:
the number of target data states for which the verify tests are performed after the one program pulse is a function of a program loop number in the programming pass.

11. The memory device of claim 9, wherein:
the at least one characteristic comprises a step size of the another program pulse; and
the step size is relatively smaller when the number of target data states for which the verify tests are performed after the one program pulse is relatively larger.

12. The memory device of claim 9, wherein:
the at least one characteristic comprises a duration of the another program pulse; and
the duration is relatively smaller when the number of target data states for which the verify tests are performed after the one program pulse is relatively larger.

13. A method for programming, comprising:
performing one program-verify iteration of a plurality of program-verify iterations in a programming pass for a set of memory cells, the set of memory cells are to be programmed to a plurality of target data states in the programming pass, the performing the one program-verify iteration comprises performing programming of the set of memory cells followed by performing verify tests for a number of target data states of the plurality of target data states, wherein the number of target data states for which the verify tests in the one program-verify iteration are performed is one or more but is fewer than all of the target data states; and
after the one program-verify iteration, performing another program-verify iteration of the plurality of program-verify iterations by performing programming of the set of memory cells followed by performing verify tests for a number of target data states of the plurality of target data states, wherein at least one characteristic of the programming of the set of memory cells in the another program-verify iteration is a function of the number of target data states for which the verify tests in the one program-verify iteration are performed.

14. The method of claim 13, wherein:
a time between a program pulse of the programming of the one program-verify iteration and a program pulse of the programming of the one program-verify iteration is relatively larger when the number of target data states for which the verify tests in the one program-verify iteration are performed is relatively larger.

15. The method of claim 13, wherein:
the at least one characteristic comprises a step size of a program pulse; and
the step size is relatively smaller when the number of target data states for which the verify tests in the one program-verify iteration are performed is relatively larger.

16. The method of claim 13, wherein:
the at least one characteristic comprises a duration of a program pulse; and
the duration is relatively smaller when the number of target data states for which the verify tests in the one program-verify iteration are performed is relatively larger.

17. The method of claim 13, wherein:
the at least one characteristic comprises a step size and a duration of a program pulse; and
the step size and the duration are relatively smaller when the number of target data states for which the verify tests in the one program-verify iteration are performed is relatively larger.

18. The method of claim 13, wherein:
the at least one characteristic comprises a bit line voltage for memory cells of the set of memory cells which have the target data states for which the verify tests in the another program-verify iteration are performed; and
the bit line voltage is relatively higher when the number of target data states for which the verify tests in the one program-verify iteration are performed is relatively larger.

19. The method of claim 18, wherein:
a bit line voltage for memory cells of the set of memory cells which do not have the target data states for which the verify tests in the another program-verify iteration are performed is not a function of the number of target data states for which the verify tests in the one program-verify iteration are performed.

20. The method of claim 13, wherein:
the at least one characteristic is a function of the target data states for which the verify tests in the another program-verify iteration are performed.

21. The method of claim 13, wherein:
the number of target data states for which the verify tests in the one program-verify iteration are performed is a function of a position of the one program-verify iteration in the programming pass.

22. The method of claim 21, wherein:
the number of target data states for which the verify tests in the one program-verify iteration are performed is relatively lower when the one program-verify iteration is at a start of the programming pass than when the one program-verify iteration is at a midpoint of the programming pass.

23. The method of claim 21, wherein:
the function is a nonlinear function.

* * * * *